US007189940B2

(12) United States Patent
Kumar et al.

(10) Patent No.: US 7,189,940 B2
(45) Date of Patent: Mar. 13, 2007

(54) PLASMA-ASSISTED MELTING

(75) Inventors: Satyendra Kumar, Troy, MI (US); Devendra Kumar, Rochester Hills, MI (US)

(73) Assignee: BTU International Inc., N. Billerica, MA (US)

( * ) Notice: Subject to any disclaimer, the term of this patent is extended or adjusted under 35 U.S.C. 154(b) by 260 days.

(21) Appl. No.: 10/449,600

(22) Filed: Jun. 2, 2003

(65) Prior Publication Data
US 2004/0107796 A1 Jun. 10, 2004

Related U.S. Application Data

(63) Continuation-in-part of application No. PCT/US03/14133, filed on May 7, 2003.

(60) Provisional application No. 60/430,677, filed on Dec. 4, 2002, provisional application No. 60/435,278, filed on Dec. 23, 2002.

(51) Int. Cl.
*B23K 10/00* (2006.01)

(52) U.S. Cl. .................. 219/121.43; 219/121.4; 219/121.59; 219/121.36; 373/18; 588/900

(58) Field of Classification Search .......... 219/121.59, 219/121.36, 121.37, 121.48; 373/18–22; 588/227, 900
See application file for complete search history.

(56) References Cited

U.S. PATENT DOCUMENTS 3,432,296 A   3/1969   McKinnon et al.
3,612,686 A   10/1971  Braman
3,731,047 A   5/1973   Mullen et al.
4,004,934 A   1/1977   Prochazka
4,025,818 A   5/1977   Giguere
4,090,055 A   5/1978   King
4,147,911 A   4/1979   Nishitani
4,151,034 A   4/1979   Yamamoto et al.

(Continued)

FOREIGN PATENT DOCUMENTS

DD           222 348 A1   5/1985

(Continued)

OTHER PUBLICATIONS

International Search Report dated Jun. 14, 2005, from corresponding PCT Application No. PCT/US03/38459.

(Continued)

*Primary Examiner*—Mark Paschall
(74) *Attorney, Agent, or Firm*—Weingarten, Schurgin, Gagnebin & Lebovici LLP

(57) ABSTRACT

Apparatus and methods for plasma-assisted melting are provided. In one embodiment, a plasma-assisted melting method can include: (1) adding a solid to a melting region, (2) forming a plasma in a cavity by subjecting a gas to electromagnetic radiation having a frequency less than about 333 GHz in the presence of a plasma catalyst, wherein the cavity has a wall, (3) sustaining the plasma in the cavity such that energy from the plasma passes through the wall into the melting region and melts the solid into a liquid, and (4) collecting the liquid. Solids that can be melted consistent with this invention can include metals, such as metal ore and scrap metal. Various plasma catalysts are also provided.

49 Claims, 15 Drawing Sheets

U.S. PATENT DOCUMENTS

| | | | |
|---|---|---|---|
| 4,213,818 A | 7/1980 | Lemons et al. | |
| 4,230,448 A | 10/1980 | Ward et al. | |
| 4,265,730 A | 5/1981 | Hirose et al. | |
| 4,307,277 A | 12/1981 | Maeda et al. | |
| 4,339,326 A | 7/1982 | Hirose et al. | |
| 4,404,456 A | 9/1983 | Cann | |
| 4,473,736 A | 9/1984 | Bloyet et al. | |
| 4,479,075 A | 10/1984 | Elliott | |
| 4,500,564 A | 2/1985 | Enomoto | |
| 4,504,007 A | 3/1985 | Anderson, Jr. | |
| 4,609,808 A | 9/1986 | Bloyet et al. | |
| 4,611,108 A | 9/1986 | Leprince et al. | |
| 4,624,738 A | 11/1986 | Westfall et al. | |
| 4,666,775 A | 5/1987 | Kim et al. | |
| 4,687,560 A | 8/1987 | Tracy | |
| 4,698,234 A | 10/1987 | Ovshinsky | |
| 4,760,230 A | 7/1988 | Hassler | |
| 4,767,902 A | 8/1988 | Palaith | |
| 4,772,770 A | 9/1988 | Matsui | |
| 4,792,348 A | 12/1988 | Pekarsky | |
| 4,840,139 A | 6/1989 | Takei | |
| 4,871,581 A | 10/1989 | Yamazaki | |
| 4,877,589 A | 10/1989 | O'Hare | |
| 4,877,938 A | 10/1989 | Rau et al. | |
| 4,883,570 A | 11/1989 | Efthimion et al. | |
| 4,888,088 A | 12/1989 | Slomowitz | |
| 4,891,488 A | 1/1990 | Davis | |
| 4,893,584 A | 1/1990 | Doehler et al. | |
| 4,908,492 A | 3/1990 | Okamoto et al. | |
| 4,919,077 A | 4/1990 | Oda | |
| 4,924,061 A | 5/1990 | Labat | |
| 4,946,547 A | 8/1990 | Palmour | |
| 4,956,590 A | 9/1990 | Phillips | |
| 4,963,709 A | 10/1990 | Kimrey | |
| 4,972,799 A | 11/1990 | Misumi | |
| 5,003,152 A | 3/1991 | Matsuo et al. | |
| 5,010,220 A | 4/1991 | Apte | |
| 5,015,349 A | 5/1991 | Suib et al. | |
| 5,017,404 A | 5/1991 | Paquet | |
| 5,023,056 A | 6/1991 | Aklufi | |
| 5,058,527 A | 10/1991 | Ohta et al. | |
| 5,072,650 A | 12/1991 | Phillips | |
| 5,074,112 A | 12/1991 | Walton | |
| 5,085,885 A | 2/1992 | Foley et al. | |
| 5,087,272 A | 2/1992 | Nixdorf | |
| 5,103,715 A | 4/1992 | Phillips | |
| 5,120,567 A | 6/1992 | Frind et al. | |
| 5,122,633 A | 6/1992 | Moshammer | |
| 5,131,993 A | 7/1992 | Suib et al. | |
| 5,164,130 A | 11/1992 | Holcombe | |
| 5,202,541 A | 4/1993 | Patterson | |
| 5,222,448 A * | 6/1993 | Morgenthaler et al. | 110/346 |
| 5,223,308 A | 6/1993 | Doehler | |
| 5,224,117 A | 6/1993 | Kruger et al. | |
| 5,227,695 A | 7/1993 | Pelletier | |
| 5,271,963 A | 12/1993 | Elchman et al. | |
| 5,276,297 A * | 1/1994 | Nara | 219/121.43 |
| 5,276,386 A | 1/1994 | Watanabe | |
| 5,277,773 A | 1/1994 | Murphy | |
| 5,284,544 A | 2/1994 | Mizutani et al. | |
| 5,304,766 A | 4/1994 | Baudet et al. | |
| 5,307,892 A | 5/1994 | Phillips | |
| 5,310,426 A | 5/1994 | Mori | |
| 5,311,906 A | 5/1994 | Phillips | |
| 5,316,043 A | 5/1994 | Phillips | |
| 5,321,223 A | 6/1994 | Kimrey | |
| 5,349,154 A | 9/1994 | Harker et al. | |
| 5,366,764 A | 11/1994 | Sunthankar | |
| 5,370,525 A | 12/1994 | Godon | |
| 5,423,180 A | 6/1995 | Nobue et al. | |
| 5,435,698 A | 7/1995 | Phillips | |
| 5,449,887 A | 9/1995 | Holcombe | |
| 5,487,811 A | 1/1996 | Iizuka | |
| 5,505,275 A | 4/1996 | Phillips | |
| 5,514,217 A | 5/1996 | Niino | |
| 5,520,740 A | 5/1996 | Kanai | |
| 5,521,360 A | 5/1996 | Johnson et al. | |
| 5,523,126 A | 6/1996 | Sano | |
| 5,527,391 A | 6/1996 | Echizen et al. | |
| 5,536,477 A | 7/1996 | Cha et al. | |
| 5,597,456 A | 1/1997 | Maruyama et al. | |
| 5,607,509 A | 3/1997 | Schumacher | |
| 5,616,373 A | 4/1997 | Karner | |
| 5,637,180 A | 6/1997 | Gosain et al. | |
| 5,645,897 A | 7/1997 | Andra | |
| 5,651,825 A | 7/1997 | Nakahigashi et al. | |
| 5,662,965 A | 9/1997 | Deguchi | |
| 5,670,065 A | 9/1997 | Bickmann et al. | |
| 5,671,045 A | 9/1997 | Woskov | |
| 5,682,745 A | 11/1997 | Phillips | |
| 5,688,477 A | 11/1997 | Nel | |
| 5,689,949 A | 11/1997 | DeFreitas | |
| 5,712,000 A | 1/1998 | Wei et al. | |
| 5,714,010 A | 2/1998 | Matsuyama et al. | |
| 5,715,677 A | 2/1998 | Wallman et al. | |
| 5,734,501 A | 3/1998 | Smith | |
| 5,741,364 A | 4/1998 | Kodama | |
| 5,755,097 A | 5/1998 | Phillips | |
| 5,794,113 A | 8/1998 | Munir et al. | |
| 5,796,080 A | 8/1998 | Jennings | |
| 5,808,282 A | 9/1998 | Apte | |
| 5,828,338 A | 10/1998 | Gerstenberg | |
| 5,841,237 A | 11/1998 | Alton | |
| 5,847,355 A | 12/1998 | Barmatz et al. | |
| 5,848,348 A | 12/1998 | Dennis | |
| 5,859,404 A | 1/1999 | Wei | |
| 5,868,871 A | 2/1999 | Yokose et al. | |
| 5,874,705 A | 2/1999 | Duan | |
| 5,904,993 A | 5/1999 | Takeuchi | |
| 5,939,026 A | 8/1999 | Seki et al. | |
| 5,945,351 A | 8/1999 | Mathuni | |
| 5,961,773 A | 10/1999 | Ichimura et al. | |
| 5,961,871 A | 10/1999 | Bible et al. | |
| 5,973,289 A * | 10/1999 | Read et al. | 219/121.48 |
| 5,976,429 A | 11/1999 | Chen | |
| 5,980,843 A | 11/1999 | Silversand | |
| 5,980,999 A | 11/1999 | Goto et al. | |
| 5,989,477 A | 11/1999 | Berger | |
| 5,993,612 A | 11/1999 | Rostaing et al. | |
| 5,998,774 A | 12/1999 | Joines et al. | |
| 6,011,248 A | 1/2000 | Dennis | |
| 6,028,393 A | 2/2000 | Izu | |
| 6,038,854 A | 3/2000 | Penetrante et al. | |
| 6,039,834 A | 3/2000 | Tanaka et al. | |
| 6,054,693 A | 4/2000 | Barmatz et al. | |
| 6,054,700 A | 4/2000 | Rokhvarger | |
| 6,096,389 A | 8/2000 | Kanai | |
| 6,101,969 A | 8/2000 | Niori | |
| 6,103,068 A | 8/2000 | Merten et al. | |
| 6,121,109 A | 9/2000 | Chen et al. | |
| 6,122,912 A | 9/2000 | Phillips | |
| 6,131,386 A | 10/2000 | Trumble | |
| 6,132,550 A | 10/2000 | Shiomi | |
| 6,139,656 A | 10/2000 | Wilkosz et al. | |
| 6,149,985 A | 11/2000 | Grace et al. | |
| 6,152,254 A | 11/2000 | Phillips | |
| 6,153,868 A | 11/2000 | Marzat | |
| 6,183,689 B1 | 2/2001 | Roy et al. | |
| 6,186,090 B1 | 2/2001 | Dotter | |
| 6,189,482 B1 | 2/2001 | Zhao | |
| 6,204,190 B1 | 3/2001 | Koshido | |
| 6,204,606 B1 | 3/2001 | Spence | |
| 6,224,836 B1 | 5/2001 | Moisan et al. | |
| 6,228,773 B1 | 5/2001 | Cox | |

| | | | | | | |
|---|---|---|---|---|---|---|
| 6,238,629 B1 | 5/2001 | Barankova et al. | | EP | 1 093 846 A1 | 4/2001 |
| 6,248,206 B1 | 6/2001 | Herchen et al. | | EP | 1 427 265 A2 | 6/2004 |
| 6,264,812 B1 | 7/2001 | Raaijmakers et al. | | JP | 56-140021 A2 | 11/1981 |
| 6,284,202 B1 | 9/2001 | Cha et al. | | JP | 57-119164 A2 | 7/1982 |
| 6,287,980 B1 | 9/2001 | Hanazaki et al. | | JP | 58-025073 A | 2/1983 |
| 6,287,988 B1 | 9/2001 | Nagamine et al. | | JP | 59-103348 A | 6/1984 |
| 6,297,172 B1 | 10/2001 | Kashiwagi | | JP | 59-169053 A | 9/1984 |
| 6,297,595 B1 | 10/2001 | Stimson | | JP | 62-000535 A | 1/1987 |
| 6,329,628 B1 | 12/2001 | Kuo | | JP | 04-74858 A | 3/1992 |
| 6,342,195 B1 | 1/2002 | Roy et al. | | JP | 06-345541 A | 12/1994 |
| 6,345,497 B1 | 2/2002 | Penetrante et al. | | JP | 07-153405 A | 6/1995 |
| 6,348,158 B1 | 2/2002 | Samukawa | | JP | 09-235686 A | 2/1996 |
| 6,358,361 B1 | 3/2002 | Matsumoto | | JP | 08-217558 A | 8/1996 |
| 6,362,449 B1 * | 3/2002 | Hadidi et al. ......... 219/121.36 | | JP | 08-281423 A | 10/1996 |
| 6,365,885 B1 | 4/2002 | Roy et al. | | JP | 09-017597 A | 1/1997 |
| 6,367,412 B1 | 4/2002 | Ramaswamy et al. | | JP | 09-023458 A | 1/1997 |
| 6,370,459 B1 | 4/2002 | Phillips | | JP | 09-027459 A | 1/1997 |
| 6,372,304 B1 | 4/2002 | Sano et al. | | JP | 09-027482 A | 1/1997 |
| 6,376,027 B1 | 4/2002 | Lee et al. | | JP | 09-078240 A | 3/1997 |
| 6,383,333 B1 | 5/2002 | Haino et al. | | JP | 09-102400 A | 4/1997 |
| 6,383,576 B1 | 5/2002 | Matsuyama | | JP | 09-102488 A | 4/1997 |
| 6,388,225 B1 | 5/2002 | Blum et al. | | JP | 09-111461 A | 4/1997 |
| 6,392,350 B1 | 5/2002 | Amano | | JP | 09-137274 A | 5/1997 |
| 6,407,359 B1 | 6/2002 | Lagarde et al. | | JP | 09-157048 A | 6/1997 |
| 6,488,112 B1 | 12/2002 | Kleist | | JP | 09-223596 A | 8/1997 |
| 6,512,216 B2 | 1/2003 | Gedevanishvili et al. | | JP | 09-235686 A | 9/1997 |
| 6,522,055 B2 | 2/2003 | Uemura et al. | | JP | 09-251971 A | 9/1997 |
| 6,575,264 B2 | 6/2003 | Spadafora | | JP | 09-295900 A | 11/1997 |
| 6,592,664 B1 | 7/2003 | Frey et al. | | JP | 10-066948 A | 3/1998 |
| 6,610,611 B2 | 8/2003 | Liu et al. | | JP | 10-081588 A | 3/1998 |
| 6,712,298 B2 | 3/2004 | Kohlberg et al. | | JP | 10-081970 A | 3/1998 |
| 6,717,368 B1 | 4/2004 | Skamoto et al. | | JP | 10-087310 A | 4/1998 |
| 6,870,124 B2 | 3/2005 | Kumar et al. | | JP | 10-204641 A | 8/1998 |
| 2001/0027023 A1 | 10/2001 | Ishihara et al. | | JP | 10-259420 A | 9/1998 |
| 2001/0028919 A1 | 10/2001 | Liu et al. | | JP | 10-294306 A | 11/1998 |
| 2002/0034461 A1 | 3/2002 | Segal | | JP | 11-031599 A | 2/1999 |
| 2002/0036187 A1 | 3/2002 | Ishll et al. | | JP | 11-106947 A | 4/1999 |
| 2002/0100751 A1 * | 8/2002 | Carr ........................ 219/209 | | JP | 11-145116 A | 5/1999 |
| 2002/0124867 A1 | 9/2002 | Kim et al. | | JP | 11-186222 A | 7/1999 |
| 2002/0135308 A1 | 9/2002 | Janos et al. | | JP | 11-228290 A | 8/1999 |
| 2002/0140381 A1 | 10/2002 | Golkowski et al. | | JP | 11-265885 A | 9/1999 |
| 2002/0190061 A1 | 12/2002 | Gerdes et al. | | JP | 11-273895 A | 10/1999 |
| 2002/0197882 A1 | 12/2002 | Niimi et al. | | JP | 11-297266 A | 10/1999 |
| 2003/0071037 A1 | 4/2003 | Sato et al. | | JP | 2000-012526 A | 1/2000 |
| 2003/0111334 A1 | 6/2003 | Dodelet et al. | | JP | 2000-173989 A | 6/2000 |
| 2003/0111462 A1 | 6/2003 | Sato et al. | | JP | 2000-203990 A | 7/2000 |
| 2004/0001295 A1 | 1/2004 | Kumar et al. | | JP | 2000-269182 A | 9/2000 |
| 2004/0004062 A1 | 1/2004 | Kumar et al. | | JP | 2000-288382 A | 10/2000 |
| 2004/0070347 A1 | 4/2004 | Nishida et al. | | JP | 2000-306901 A | 11/2000 |
| 2004/0089631 A1 | 5/2004 | Blalock et al. | | JP | 2000-310874 A | 11/2000 |
| 2004/0107796 A1 | 6/2004 | Kumar et al. | | JP | 2000-310876 A | 11/2000 |
| 2004/0107896 A1 | 6/2004 | Kumar et al. | | JP | 2000-317303 A | 11/2000 |
| 2004/0118816 A1 | 6/2004 | Kumar et al. | | JP | 2000-323463 A | 11/2000 |
| | | | | JP | 2000-348897 A | 12/2000 |
| FOREIGN PATENT DOCUMENTS | | | | JP | 2001-013719 A | 1/2001 |
| DE | | 195 42 352 A1 | 5/1997 | JP | 2001-053069 A | 2/2001 |
| DE | | 100 05 146 A1 | 8/2001 | JP | 2001-058127 A | 3/2001 |
| EP | | 0 228 864 B1 | 7/1987 | JP | 2001-093871 A | 4/2001 |
| EP | | 0 335 675 A2 | 10/1989 | JP | 2001-149754 A | 6/2001 |
| EP | | 0 435 591 A2 | 12/1990 | JP | 2001-149918 A | 6/2001 |
| EP | | 0 436 361 A1 | 12/1990 | JP | 2001-196420 A | 7/2001 |
| EP | | 0 228 864 B1 | 3/1991 | JP | 2001-303252 A | 10/2001 |
| EP | | 0 420 101 A2 | 4/1991 | JP | 2001-332532 A | 11/2001 |
| EP | | 0 435 591 A2 | 7/1991 | JP | 2001-351915 A | 12/2001 |
| EP | | 0 436 361 A1 | 7/1991 | JP | 2002-022135 A | 1/2002 |
| EP | | 0435591 * | 7/1991 | JP | 2002-028487 A | 1/2002 |
| EP | | 0 520 719 B1 | 12/1992 | JP | 2002-069643 A | 3/2002 |
| EP | | 0 670 666 B1 | 9/1995 | JP | 2002-075960 A | 3/2002 |
| EP | | 0 520 719 B1 | 5/1996 | JP | 2002-126502 A | 5/2002 |
| EP | | 0 724 720 B1 | 8/1996 | JP | 2002-273161 A | 9/2002 |
| EP | | 0 670 666 B1 | 6/1998 | JP | 2002-273168 A | 9/2002 |
| EP | | 0 724 720 B1 | 5/2000 | JP | 2003-075070 A | 3/2003 |
| | | | | JP | 2003-264057 A | 9/2003 |

| | | |
|---|---|---|
| WO | WO 95-11442 A1 | 4/1995 |
| WO | WO 96/06700 A1 | 3/1996 |
| WO | WO 96/38311 A1 | 12/1996 |
| WO | WO 97-13141 A1 | 4/1997 |
| WO | WO 01-55487 A2 | 8/2001 |
| WO | WO 01-58223 A1 | 8/2001 |
| WO | WO 01-82332 A1 | 11/2001 |
| WO | WO 02-26005 A1 | 3/2002 |
| WO | WO 02-026005 A1 | 3/2002 |
| WO | WO 02-061165 A1 | 8/2002 |
| WO | WO 02-061171 A1 | 8/2002 |
| WO | WO 02-062114 A1 | 8/2002 |
| WO | WO 02-062115 A1 | 8/2002 |
| WO | WO 02-067285 A2 | 8/2002 |
| WO | WO 02-067285 A3 | 8/2002 |
| WO | WO 03-018862 A2 | 3/2003 |
| WO | WO 03-018862 A3 | 3/2003 |
| WO | WO 03-028081 A2 | 4/2003 |
| WO | WO 03-095058 A2 | 11/2003 |
| WO | WO 03-095089 A1 | 11/2003 |
| WO | WO 03-095090 A1 | 11/2003 |
| WO | WO 03-095130 A1 | 11/2003 |
| WO | WO 03-095591 A1 | 11/2003 |
| WO | WO 03-095699 A1 | 11/2003 |
| WO | WO 03-095807 A1 | 11/2003 |
| WO | WO 03-096369 A1 | 11/2003 |
| WO | WO 03-096370 A1 | 11/2003 |
| WO | WO 03-096380 A2 | 11/2003 |
| WO | WO 03-096381 A2 | 11/2003 |
| WO | WO 03-096382 A2 | 11/2003 |
| WO | WO 03-096383 A2 | 11/2003 |
| WO | WO 03-096747 A2 | 11/2003 |
| WO | WO 03-096749 A1 | 11/2003 |
| WO | WO 03-096766 A1 | 11/2003 |
| WO | WO 03-096768 A1 | 11/2003 |
| WO | WO 03-096770 A1 | 11/2003 |
| WO | WO 03-096771 A1 | 11/2003 |
| WO | WO 03-096772 A1 | 11/2003 |
| WO | WO 03-096773 A1 | 11/2003 |
| WO | WO 03-096774 A1 | 11/2003 |
| WO | WO 04-050939 A2 | 6/2004 |

OTHER PUBLICATIONS

Accentus—http://www.accentus.co.uk/ipco/html/techenv6_txt_fr.html.
Agrawal et al., "Grain Growth Control in Microwave Sintering of Ultrafine WC-Co Composite Powder Compacts," Euro PM99, Sintering, Italy, 8 pages (1999).
Agrawal et al., "Microwave Sintering of Commercial WC/Co Based Hard Metal Tools," Euro PM99, Sintering, Italy, 8 pages (1999).
Agrawal, D., "Metal Parts from Microwaves," 2 pages.
Agrawal, D., "Microwave Processing of Ceramics," *Current Opinion in Solid State and Material Science*, 3:480-485 (1998).
Air Liquide, Heat Treatment—Gas Quenching,—http://www.airliquide.com/en/business/industry/metals/applications/heat_treatment/quenching, 1 page (2000).
Alexander et al., "Electrically Conducive Polymer Nanocomposite Materials," AFRL's Materials and Manufacturing Directorate, Non-metallic Materials Division, Polymer Branch, Wright-Patterson AFB OH—http://www.afrlhorizons.com/Briefs/Sept02/ML0206.html, 2 pages (Sep. 2002).
Al-Shamma'a et al., "Microwave Atmospheric Plasma for Cleaning Exhaust Gases and Particulates," University of Liverpool, Dept. of Electrical Engineering and Electronics.
Alton et al., "A High-Density, RF Plasma-Sputter Negative Ion Source," 3 pages.
Anklekar et al., Microwave Sintering And Mechanical Properties of PM Copper Steel, pp. 355-362 (2001).
Batanov et al., "Plasmachemical Deposition of Thin Films in a Localized Free-Space Microwave Discharge," *Technical Physics*, 38:6, pp. 475-479 (1993).
Carbonitriding, Treat All Metals, Inc., 2 pages—http://www.treatallmetals.com/carbon.htm.

Carburizing,—Heat Treating by Treat All Metals—http://www.treatallmetals.com/gas.htm, 2 pages.
Cheng et al., "Microwave Processing of WC-Co Composites And Ferroic Titanates" (Original Article), *Mat Res Innovat* (1):44-52 (1997).
Cheng, J., "Fabricating Transparent Ceramics by Microwave Sintering," *Focus on Electronics*, 79:9, pp. 71-74 (2000).
Circle Group Holdings, Inc. eMentor Companies "StarTech Environmental Corp."—http://www.crgq.com/cgiweb/HTML/eMentor_Companies/startech.html, 9 pages.
Classification of Cast Iron—Key to Steel—Article—http://www.key-to-steel.com/Articles/Art63.htm, 3 pages.
Collin, *Foundations for Microwave Engineering*, 2d Ed., IEEE Press, NY, pp. 180-192 (2001).
Controlled Atmosphere Sinter-Hardening, 2 pages.
Egashira, "Decomposition of Trichloroethylene by Microwave-induced Plasma Generated from SiC whiskers," *J. Electrochem. Soc.*, 145:1, pp. 229-235 (Jan. 1998).
Ford 1.3L Catalytic Converter (1988-1989)—http://catalytic-converters.com/FO13L43778889.html, 1 page.
Ford Contour Catalytic Converter (1995-1996)—http://www.all-catalytic-converters.com/ford-contour-converter.html, 2 pages.
Fraunhofer ILT, "Plasma-Reactors for Aftertreatment of Automobile Exhaust Gas," Fraunhofer-Gesellschaft (2002)—http://www.ilt.fhg.de/eng/jb01-s35.html, 1 page.
French, "The Plasma Waste Converter—From Waste Disposal to Energy Creation,"—http://www.arofe.army.mil/Conferences/CWC2001/French.htm, p. 1.
Gao et al., "Superfast Densification of Oxide/Oxide Ceramic Composites," *J. Am. Ceram. Soc.* 82[4]1061-63 (1999)—http://216.239.39.100/search?q=cache:b-TFhQInU6YC:www.umr.edu/~hruiz/GaoShen.ppt+spark+plasma.
Gedevanishivili et al., "Microwave Combustion Synthesis And Sintering of Intermetallics And Alloys," *Journal of Materials Science Letters*, (18), pp. 665-668 (1999).
General Eastern, Semiconductor Manufacturing—Using the HygroTwin 2850 to Reduce Costs, Improve Quality, TIM 003, 3 pages, (1997).
George, S.J., "The Catalytic Converter," 5 pages, (2002)—http://krioma.net/Articles/Catalytic%20Converter/Catalytic%20Converter.html.
GlassTesseract.Org—The Home of Kenz Benz, "Tech Procedures and Tips: Exhaust Manifolds and Catalytic Converters Removal—and Installation", 4 pages (2003)—http://glasstesseract.org/tech/catalytic.html.
Grant, J., Hackh's Chemical Dictionary, 3rd ed. p. 174-175.
Holt Walton & Hill, Heat Treatment of Steels—The Processes, Azom.com, 9 pages, (2002).
Holt Walton & Hill, Powder Metallurgy—Overview of the Powder Metallurgy Process, Azom.com, 3 pages (2002)—http://www.azom.com/details.asp?ArticleID=1414.
Honda Automobile News Press Release, "Honda Introduces Its First Two Clean Air Vehicles, the Civic Ferio LEV and Partners 1.6 LEV", 3 pages (Feb. 1997)—http://world.honda.com/news/1997/4970217a.html.
Honda Civic CX Catalytic Converter, 1 page (1996-2000)—http://www.catalyticconverters.com/HOCIVICCX4349600.html.
How A Blast Furnace Works—The Blast Furnace Plant, AISI Learning Center: http://www.steel.org/learning/howmade/blast_furnace.htm.
How Is Steel Made, Answer Discussion, 6 pages—http://ourworld.compuserve.com/homepages/Dyaros/stlmanuf.htm.
Hsu et al., "Palladium-Coated Kieselguhr for Simultaneous Separation and Storage of Hydrogen," Westinghouse Savannah River Company, U.S. Dept. of Commerce, National Technical Information Service, 14 pages (2001).
Hydrogen Separation Membrane,—Advanced Gas Separation: H2 Separation, 1 page (2001).
IRC in Materials Processing, "Advanced Melting, Atomisation, Powder and Spray Forming, Plasma Melting—Operation of a Plasma Furnace," University of Birmingham, 3 pages—http://www.irc.bham.ac.uk/theme1/plasma/furnace.htm.
*Iron and Steel*, 6:(16-22).

Japanese Advanced Environment Equipment, "Waste and Recycling Equipment—Mitsubishi Graphi Electrode Type Plasma Furnace," 3 pages—http://nett21.unep.or.jp/JSIM_DATA/WASTE/WASTE_3/html/Doc_467.html.

Johnson, D.L., "Fundamentals of Novel Materials Processing," Dept. of Materials Science & Engineering, Northwestern University, 2 pages—http://www.matsci.northerwestern.edu/faculty/dlj.html.

Kalyanaraman et al., "Synthesis and Consolidation of Iron Nanopowders," *NanoStructured Materilas*, vol. 10, No. 8, pp. 1379-1392 (1998).

Karger, Odo—Area of Work: Microwave Welding, 2 pages (Nov. 2002).

Kong et al., "Nuclear-Energy-Assisted Plasma Technology for Producing Hydrogen," Nuclear Energy Research Initiative, 4 pages (2002).

Lewis, R. J. Sr., "Hawley's Condensed Chemical Dictionary," 12th ed., p. 230-232 (1993).

Lucas, J., "Welding Using Microwave Power Supplies," Computer Electronics & Robotics—http://www.liv.ac.uk/EEE/research/cer/project6.htm.

Luggenholscher et al., "Investigations on Electric Field Distributions in a Microwave Discharge in Hydrogen," Institute fur Laser-und Plasmaphysik, Univsitat Essen, Germany, 4 pages.

Microelectronics Plasma Applications,—March Plasma Systems, 2 pages (2002)—http://www.marchplasma.com/micro_app.htm.

Micro-fabricated Palladium-Silver Membrane for Hydrogen Separation and Hydro/Dehydrogenation Reactions, Research Education Group, 5 pages—http://utep.el.utwente.nl/tt/projects/sepmem/.

Microwave Joining of Alumina and Zirconia Ceramics, IRIS, Research Topics 1998, 1 page.

Microwave Welding (EWi Welding Network) 1 page—http://www.ferris.edu/cot/accounts/plastics/ htdocs/Prey/Microwave%20Homepage.htm.

Microwave Welding of Plastics, TWI World Centre for Materials Joining Technology, 2 pages, (Aug. 2002)—http://www.twi.co.uk/j32k/protected/band_3/ksab001.htm.

Microwave Welding, Welding and Joining Information Network, 3 pages (Nov. 2002)—http://www.ewi.org/technologies/plastics/microwave.asp.

Moss et al., "Experimental Investigation of Hydrogen Transport Through Metals," Los Alamos National Library, 5 pages—http://www.education.lanl.gov/RESOURCES/h2/dye/education.html.

Nitriding, Treat All Metals, Inc., 2 pages—http://www.treatallmetals.com/nitrid.htm.

Non-Thermal Plasma Aftertreatment of Particulates—Theoretical Limits and Impact on Reactor Design, 27 pages—http://www.aeat.com/electrocat/sae/intro . . .references.htm.

Office of Energy Efficiency, "Using Non-Thermal Plasma Reactor to Reduce NOx Emissions from CIDI Engines," 1 page (Apr. 1999).

Optoelectronic Packaging Applications, March Plasma Systems, 2 pages (2002)—http://www.marchplasma.com/opto_app.htm.

Paglieri et al., "Palladium Alloy Composite Membranes for Hydrogen Separation," Abstract, Los Alamos National Library, 5 pages.

Peelamedu et al., "Anisothermal Reaction Synthesis of Garnets, Ferrites, And Spinels In Microwave Field," *Materials Research Bulletin* (36):2723-2739 (2001).

PerfectH2TM PE8000 Series, "Palladium Diffusion Hydrogen Purifier For High Flow Rate MOCVD Applications" Matheson Tri.Gas, 2 pages (2002).

Photonics Dictionary, "Definition for Word(s): Thyratron" (Laurin Publishing), 2 pages (1996-2003)—http://www.photonics.com/dictionary/lookup/lookup.asp?url=lookup&entrynum=538.

Pingel, V.J., "About What Every P/A Should Know About P/M," Powder Metallurgy Co., 9 pages—http://www.powdermetallurgyco.com/pm_about.htm.

Plasma Applications, Coalition for Plasma Science, 2 pages (1999, 2000)—http://www.plasmacoalition.org/applications.htm.

Plasma Carburizing, 1 page—http://www.ndkinc.co.jp/ndke04.html.

Plasma Direct Melting Furnace, Materials Magic, Hitachi Metals Ltd., 3 pages—http://www.hitachi-metals.co.jp/e/prod/prod07/p07_2_02.html.

Plasma Electronics, Classical Plasma Applications, 2 pages (2002)—http://www.plasma.iinpe.br/English/Classical_Applications.htm.

Plasma Nitride Process Description, Northeast Coating Technologies, 2 pages.

Plasma Science and Technology, "Plasmas for Home, Business and Transportation," p. 4—http://www.plasmas.org/rot-home.htm.

Plasma-Assisted Catalyst Systems, Novel Plasma Catalysts Significantly Reduce NOx from Diesel Engines, 2 pages (Apr. 2001)—http://www.ott.doe.gov/success.html (2 pages).

Printed Circuit Board (PCB) Plasma Applications, March Plasma Systems, 2 pages (2002)—http://www.marchplasma.com/pcb_app.01.htm.

Roy et al., "Full Sintering of Powdered-Metal Bodies In A Microwave Field," *Nature*, vol. 399, pp. 668-670 (Jun. 17, 1999).

Roy et al., "Microwave Processing: Triumph of Applications-Driven Science in WC-Composites And Ferroic Titanates," *Ceramic Transactions*, vol. 80, pp. 3-26, (1997).

Roy et al., "Definitive Experimental Evidence for Microwave Effects: Radically New Effects of Separated E and H Fields, Such As Decrystallization of Oxides in Seconds," *Materials Research Innovations*, Springer-Verlag, vol. 6, No. 3, pp. 129-140 (2002).

Roy et al., "Major phase transformations and magnetic property changescaused by electromagnetic fields at microwave frequencies," *Journal Of Material Research*, 17:12, pp. 3008-3011 (2002).

Rusanov, V. D., Hydrogen Energy & Plasma Technologies Institute: Russian Research Centre Kurchatov Institute, 13 pages,—http://www.kiae.ru/eng/str/ihept/oiivept.htm.

Samant et al., "Glow Discharge Nitriding Al 6063 Samples and Study of Their Surface Hardness," Metallofizika I Noveishe Takhnologii, 23(3), pp. 325-333 (2001).

Sato et al., Surface Modification of Pure Iron by RF Plasma Nitriding with DC Bias Voltage Impression, *Hyomen Gijutsu* 48(3), pp. 317-323 (1997) (English Abstract).

Saveliev Y. "Effect of Cathode End Caps and a Cathode Emissive Surface on Relativistic Magnetron Opeartion," *IEEE Transactions on Plasma Science*, 28:3, pp. 478-484 (Jun. 2000).

SC/Tetra Engine Manifold Application, 2 pages (2001)—http://www.sctetra.com/applications/01_manifold.htm.

Shulman et al., "Microwaves In High-Temperature Processes," GrafTech, 8 pages (Mar. 2003) http://www.industrialheating.com/CDA/ArticleInformation/features/BNP_Features_Item/0,2832,94035,00.html.

Slone et al., "Nox Reduction For Lean Exhaust Using Plasma Assisted Catalysis," Noxtech Inc., 5 pages (2000)—http://www.osti.gov/fcvt/deer2000/bhattpa.pdf.

Stockwell Rubber Company, Inc., "Conductive Silicone Rubber Compounds Product Selection Guide," Electrically Conducive Materials, 3 pages—http://www.stockwell.com/electrically_conducive_produc.htm.

Sumitomo Heavy Industries, Ltd., "Spark Plasma Sintering—What is Spark Plasma Sintering," 3 pages (2001)—http://www.shi.co.jp/sps/eng/.

Surface Hardening AHS Corp., 5 pages—http://www.ahscorp.com/surfaceh.html.

Takizawa et al. "Synthesis of inorganic materials by 28 GHz MW radiation," Proceed. Of The Symposium On Mw Effects And Applications, Aug. 2, 2001, Kokushikau Univ., Tokyo, Japan, pp. 52-53, (2001).

Taube et al. "Advances in Design of Microwave Resonance Plasma Source," American Institute of Chemical Engineering, 2004 Annual Meeting, Presentation (Nov. 2004).

testMAS: Pressure Sintering, 11 pages—http://cybercut.berkley.edu/mas2/processes/sinter_pressure.

The Amazing Metal Sponge: Simulations of Palladium-Hydride, Design of New Materials, 3 pages—http://www.psc.edu/science/Wolf/Wolf.html.

Toyota Motor Sales, "Emission Sub Systems—Catalytic Converter," 10 pages.

Uchikawa et al., "New Technique of Activating Palladium Surface for Absorption of Hydrogen or Deuterium," *Japanese Journal of Applied Physics*, vol. 32 (1993), pp. 5095-5096, Part 1, No. 11A (Nov. 1993).

Wang et al., "Densification of Al2O3 Powder Using Spark Plasma Sintering," *J. Mater. Res.*, 15:4, pp. 982-987 (Apr. 2000).

Way et al., "Palladium/Copper Allow Composite Membranes for High Temperature Hydrogen Separation from Coal-Derived Gas Streams," Dept. of Chemical Engineering, Colorado School of Mines, 3 pages (1999).

Welding Breakthrough: Generating and Handling a Microwave Powered Plasma, Australian Industry News, Information & Suppliers, 7 pages (Sep. 2001)—http://www.industry/search.com.au/features/microwave.asp.

Welding Plastic Parts, Business New Publishing Company, 4 pages (Nov. 2002)—http://www.assemblymag.com/Common/print_article.asp?rID=E455512C17534C31B96D.

Xie et al., "Effect of Rare Earth in Steel on Thermochemical Treatment," Xiuou Jinshu Cailiao Yu Gongcheng, 26(1), pp. 52-55 (Feb. 1997) (English Abstract).

Yahoo Canada—Autos, "Catalytic Converter Answer2," 4 pages (2001)—http://ca.autos.yahoo.com/maintain/catalytic_converteranswer2.html.

International Search Report issued on Jun. 26, 2003, in PCT/US03/14037.

International Search Report issued on Jul. 8, 2003, in PCT/US03/14124.

International Search Report issued on Jun. 24, 2003, in PCT/US03/14132.

International Search Report issued on Jul. 29, 2003, in PCT/US03/14052.

International Search Report issued on Jul. 29, 2003, in PCT/US03/14054.

International Search Report issued on Apr. 27, 2004, in PCT/US03/14036.

International Search Report issued on Aug. 21, 2003, in PCT/US03/14053.

International Search Report issued on Feb. 8, 2004, in PCT/US03/14034.

International Search Report issued on Aug. 29, 2003, in PCT/US03/14039.

International Search Report issued on Aug. 21, 2003, in PCT/US03/14038.

International Search Report issued on Aug. 24, 2003, in PCT/US03/14133.

International Search Report issued on Jul 28, 2003, in PCT/US03/14035.

International Search Report issued on Jun. 27, 2003, in PCT/US03/14040.

International Search Report issued on Jul. 17, 2003, in PCT/US03/14134.

International Search Report issued on Jun. 27, 2003, in PCT/US03/14122.

International Search Report issued on Jun. 24, 2003, in PCT/US03/14130.

International Search Report issued on Apr. 30, 2004, in PCT/US03/14055.

International Search Report issued on Apr. 30, 2004, in PCT/US03/140137.

International Search Report issued on Aug. 21, 2003, in PCT/US03/14123.

International Search Report issued on Jul. 29, 2003, in PCT/US03/14121.

International Search Report issued on Aug. 24, 2003, in PCT/US03/14136.

International Search Report issued on May 3, 2004, in PCT/US03/14135.

Written Opinion issued on Apr. 13, 2004, in PCT/US03/014037.

Examination Report issued on Feb. 24, 2004, in PCT/US03/14054.

Written Opinion issued on Dec. 22, 2003, in PCT/US03/14053.

Examination Report issued on Apr. 26, 2004, in PCT/US03/14053.

Written Opinion issued on Dec. 22, 2003, in PCT/US03/14123.

Examination Report issued on Apr. 26, 2004, in PCT/US03/14123.

Quayle Action issued on Apr. 19, 2004, in U.S. Appl. No. 10/430,414.

Office Action issued on May 18, 2004, in U.S. Appl. No. 10/430,426.

Reply to Office Action filed on Nov. 18, 2004, in U.S. Appl. No. 10/430,426.

Office Action issued on Feb. 24, 2005, in U.S. Appl. No. 10/430,426.

Willert-Porada, M., "Alternative Sintering Methods" 1 page Abstract dated Nov. 8, 2001, http://www.itap.physik.uni-stuttgart.de/~gkig/neu/english/welcome.php?/~gkig/neu/abstracts/abstract_willert-porada.html.

Fraunhofer ILT, "Plasma-Reactors for Aftertreatment of Automobile Exhaust Gas," Fraunhofer-Gesellschaft—http://www.ilt.fhg.de/eng/jb01-s35.html, 1 page (2002).

French, "The Plasma Waste Converter—From Waste Disposal to Energy Creation," The International Chemical Weapons Demilitarization Conference, Gifu City, Japan (May 22-24, 2001)—http://www.arofe.army.mil/Conferences/CWC2001/French.htm, 1 page.

Gao et al., "Superfast Densification of Oxide/Oxide Ceramic Composites," *J. Am. Ceram. Soc.* 82(4)1061-1063 (1999).

Gedevanishvili et al., "Microwave Combustion Synthesis And Sintering of Intermetallics and Alloys," *J. Mat. Sci. Lett.* 18(9):665-668 (1999).

General Eastern, "Semiconductor Manufacturing—Using the HygroTwin 2850 to Reduce Costs, Improve Quality,", 3 pages, www.generaleastern.net (1997).

George, "The Catalytic Converter," 5 pages, (2002)—http://krioma.net/articles/Catalytic%20Converter/Catalytic%20Converter.htm.

GlassTesseract.Org website, "Tech Procedures and Tips: Exhaust Manifolds and Catalytic Converters Removal—and Installation", 4 pages (2003). http://glasstesseract.org/tech/catalytic.html.

*Hackh's Chemical Dictionary*, 3rd edition, J. Grant, Ed., McGraw Hill Book Co., NY, pp. 174-175 (1944).

"Heat Treatment of Steels—The Processes," AZoM.com, 9 pages, (2002)—www.azom.com.

"Powder Metallurgy—Overview of the Powder Metallurgy Process," AZoM.com, 3 pages (2002)—http://www.azom.com/details.asp?ArticleID=1414.

Honda Automobile News Press Release, "Honda Introduces Its First Two Clean Air Vehicles, the Civic Ferio LEV and Partner 1.6 LEV," 3 pages (Feb. 1997)—http://world.honda.com/news/1997/4970217a.html.

Honda Civic CX Catalytic Converter, (1996-2000) 1 page—http://www.catalyticconverters.com/HOCIVICCX4349600.html, Undated.

"How A Blast Furnace Works—The Blast Furnace Plant," AISI Learning Center, 7 pages. http://www.steel.org/learning/howmade/blast_furnace.htm., Undated.

"How Is Steel Made," Answer Discussion, 6 pages—http://ourworld.compuserve.com/homepages/Dyaros/stlmanuf.htm, Undated.

Hsu et al., "Palladium-Coated Kieselguhr for Simultaneous Separation and Storage of Hydrogen," Westinghouse Savannah River Company, U.S. Dept. of Commerce, National Technical Information Service, 14 pages (2001).

Fincke, "Hydrogen Separation Membrane,—Advanced Gas Separation: H2 Separation," Summary of research proposal, 1 page (2003).

"IRC in Materials Processing: Advanced Melting, Atomisation, Powder and Spray Forming, Plasma Melting—Operation of a Plasma Furnace," University of Birmingham website, 3 pages—http://www.irc.bham.ac.uk/theme1/plasma/furnace.htm, Undated.

Saville, *Iron and Steel*, Chapter 6, pp. 16-22, Wayland Publ., England (1976)..

Japanese Advanced Environment Equipment, "Mitsubishi Graphite Electrode Type Plasma Furnace," 3 pages, Undated—http://nett21.unep.or.jp/JSIM_DATA/WASTE/WASTE_3/html/Doc_467.html.

Johnson, Faculty Biography webpage, Dept. of Materials Science & Engineering, Northwestern University, 2 pages—http://www.matsci.northerwestern.edu/faculty/ dlj.html, Undated.

Kalyanaraman et al., "Synthesis and Consolidation of Iron Nanopowders," *NanoStructured Materials* 10(8):1379-1392 (1998).

Karger, Scientific Staff Research Areas for KTP Company, 2 pages (Nov. 2002)—http://wwwfb10.upb.de/KTP/KTP-ENG/Staff/Karger/body_karger.html.

Kong et al., "Nuclear-Energy-Assisted Plasma Technology for Producing Hydrogen," Nuclear Energy Research Initiative Research Proposal, 4 pages (2002).

Lewis, *Hawley's Condensed Chemical Dictionary*, 12th ed., pp. 230-232, Van Nostrand Reinhold, NY (1993).

Lucas, "Welding Using Microwave Power Supplies," Faculty webpage, 1 page—http://www.liv.ac.uk/EEE/research/cer/project6.htm, Undated.

Luggenholscher et al., "Investigations on Electric Field Distributions in a Microwave Discharge in Hydrogen," Institute fur Laser- und Plasmaphysik, Univsitat Essen, Germany, 4 pages, Undated.

March Plasma Systems, product descriptions, 2 pages (2002)—http://www.marchplasma.com/micro_app.htm, Undated.

"Micro-fabricated Palladium-Silver Membrane for Hydrogen Separation and Hydro/Dehydrogenation Reactions," Research Education Group webpage, 5 pages—http://utep.el.utwente.nl/tt/projects/sepmem/—Undated.

Ahmed et al., "Microwave Joining of Alumina and Zirconia Ceramics," IRIS Research Topics 1998, 1 page (1988).

"Microwave Welding," EWi WeldNet, 1 page—(2003) http://www.ferris.edu/cot/accounts/plastics/ htdocs/Prey/Microwave%20Homepage.htm.

"Microwave Welding of Plastics," TWI World Centre for Materials Joining Technology, 2 pages, (Aug. 2002)—http://www.twi.co.uk/j32k/protected/band_3/ksab001.htm.

"Microwave Welding," Welding and Joining Information Network, 3 pages (Nov. 2002)—http://www.ewi.org/technologies/plastics/microwave.asp.

Moss et al., "Experimental Investigation of Hydrogen Transport Through Metals," Experiment Description, Los Alamos National Library, 5 pages—Undated. http://www.education.lanl.gov/RESOURCES/h2/dye/education.html.

"Nitriding," Treat All Metals, Inc., 2 pages—Undated—http://www.treatallmetals.com/nitrid.htm.

Thomas et al., "Non-Thermal Plasma Aftertreatment of Particulates—Theoretical Limits and Impact on Reactor Design," SAE Spring Fuels and Lubes Conference, Paris, France, 27 pages—Jun. 19-22, 2000—http://www.aeat.co.uk/electrocat/sae/saepaper.htm.

"Using Non-Thermal Plasma Reactor to Reduce NOx Emissions from CIDI Engines," Office of Energy Efficiency and Renewable Energy, Office of Transportation, 1 page (Apr. 1999).

"Optoelectronic Packaging Applications," March Plasma Systems, Product Description, 2 pages (2002)—http://www.marchplasma.com/opto_app.htm.

Paglieri et al., "Palladium Alloy Composite Membranes for Hydrogen Separation," 15th Annual Conf. Fossil Energy Matter, Knoxville, TN (2001), 5 pages.

Peelamedu et al., "Anisothermal Reaction Synthesis of Garnets, Ferrites, and Spinels In Microwave Field," *Materials Research Bulletin* 36:2723-2739 (Dec. 2001).

PerfectH2 PE8000 Series Product Description, Palladium Diffusion Hydrogen Purifier For High Flow Rate MOCVD Applications, Matheson Tri.Gas, 2 pages (2002).

Photonics Directory, Definition for Thyratron, (Laurin Publishing), 2 pages http://www.photonics.com/dictionary/.

Pingel, "About What Every P/A Should Know About P/M," Powder Metallurgy Co., 9 pages—http://www.powdermetallurgyco.com/pm_about.htm.

"Plasma Applications," Coalition for Plasma Science, 2 pages (1999, 2000)—http://www.plasmacoalition.org/applications.htm.

"Plasma Carburizing," 1 page—Undated, http://www.ndkinc.co.jp/ndke04.html.

"Plasma Direct Melting Furnace," Materials Magic, Hitachi Metals Ltd., 3 pages—Undated, http://www.hitachi-metals.co.jp/e/prod/prod07/p07_2_02.html.

"Classical Plasma Applications," 2 pages (2002)—http://www.plasma.iinpe.br/English/Classical_Applications.htm.

"Plasma Nitride Process Description," Northeast Coating Technologies, 2 pages, Undated, www.northeastcoating.com.

Plasma Science and Technology, "Plasmas for Home, Business and Transportation," 4 pages—Undated. http://www.plasmas.org/rot-home.htm.

"Novel Plasma Catalysts Significantly Reduce NOx from Diesel Engines," US Department of Energy research summary, 2 pages (Apr. 2001)—http://www.ott.doe.gov/success.html.

"Printed Circuit Board (PCB) Plasma Applications," March Plasma Systems product descriptions, 2 pages (2002)—http://www.marchplasma.com/pcb_app.01.htm.

"testMAS: Pressure Sintering," 11 pages, Undated—http://cybercut.berkley.edu/mas2/processes/sinter_pressure.

Wolf et al., "The Amazing Metal Sponge: Simulations of Palladium-Hydride," 2 pages, Undated—http://www.psc.edu/science/Wolf/Wolf.html.

Toyota Motor Sales, "Emission Sub Systems—Catalytic Converter," 10 pages, Undated.

Uchikawa et al., "New Technique of Activating Palladium Surface for Absorption of Hydrogen or Deuterium," *Japanese J. Appl. Phys.* 32:5095-5096, Part 1, No. 11A (Nov. 1993).

Wang et al., "Densification of $Al_2O_3$ Powder Using Spark Plasma Sintering," *J. Mater. Res.*, 15(4):982-987 (Apr. 2000).

Way et al., "Palladium/Copper Alloy Composite Membranes for High Temperature Hydrogen Separation from Coal-Derived Gas Streams," Research Grant Report, Dept. of Chemical Engineering, Colorado School of Mines, 3 pages (1999).

Lucas, "Welding Breakthrough: Generating and Handling a Microwave Powered Plasma," Australian Industry News, Information & Suppliers, 7 pages (Sep. 2001)—http://www.industry/search.com.au/features/microwave.asp.

"Welding Plastic Parts," Business New Publishing Company, 4 pages (Nov. 2000)—http://www.assemblymag.com/Common/print_article.asp?rID=E455512C17534C31B96D.

Xie et al., "Effect of Rare Earths in Steels on the Thermochemical Treatments and the Functional Mechanisms of the Rare Earths," *Rare Metals Materials and Engineering* 26(1):52-55 (Feb. 1997) (English Abstract).

Yahoo Canada—Autos, "Catalytic Converter Answer2," 4 pages (2001)—http://ca.autos.yahoo.com/maintain/catalytic_converteranswer2.html.

International Search Report issued on Jul. 23, 2003, in PCT/US03/14037.

International Search Report issued on Aug. 15, 2003, in PCT/US03/14124.

International Search Report issued on Sep. 10, 2003, in PCT/US03/14132.

International Search Report issued on Aug. 14, 2003, in PCT/US03/14052.

International Search Report issued on Aug. 14, 2003, in PCT/US03/14054.

International Search Report issued on May 10, 2004, in PCT/US03/14036.

International Search Report issued on Aug. 9, 2003, in PCT/US03/14053.

International Search Report issued on Feb. 25, 2004, in PCT/US03/14034.

International Search Report issued on Sep. 19, 2003, in PCT/US03/14039.

International Search Report issued on Aug. 29, 2003, in PCT/US03/14038.

International Search Report issued on Dec. 30, 2003, in PCT/US03/14133.

International Search Report issued on Aug. 28, 2003, in PCT/US03/14035.

International Search Report issued on Jul. 29, 2003, in PCT/US03/14040.

International Search Report issued on Sep. 10, 2003, in PCT/US03/14134.

International Search Report issued on Aug. 29, 2003, in PCT/US03/14122.

International Search Report issued on Sep. 30, 2003, in PCT/US03/14130.

International Search Report issued on May 24, 2004, in PCT/US03/14055.

International Search Report issued on May 26, 2004, in PCT/US03/14137.

International Search Report issued on Aug. 29, 2003, in PCT/US03/14123.
International Search Report issued on Aug. 29, 2003, in PCT/US03/14121.
International Search Report issued on Sep. 16, 2003, in PCT/US03/14136.
International Search Report issued on May 25, 2003, in PCT/US03/14135.
Examination Report issued on Apr. 26, 2004, in PCT/US03/14053.
Reply to Office Action filed on Nov. 18, 2004, in U.S. Appl. No. 10/430,426.
International Preliminary Examination Report completed on Feb. 22, 2005, in PCT/US03/014037.
Application as filed in U.S. Appl. No. 11/384,104, filed on Mar. 17, 2006.
Office Action in Chinese Appl. No. 03810272.2, issued Feb. 10, 2006.
International Search Report issued on Jun. 14, 2005, in PCT/US03/38459.
Office Action mailed Nov. 10, 2005 for U.S. Appl. No. 10/430,416.
Response to Office Action filed Apr. 10, 2006 for U.S. Appl. No. 10/430,416.
Office Action mailed Jul. 27, 2005 for U.S. Appl. No. 10/430,415.
Response to Office Action dated Dec. 21, 2005 for U.S. Appl. No. 10/430,415.
Office Action mailed Apr. 5, 2006 for U.S. Appl. No. 10/430,415.
Letter from Chinese Associate enclosing office action in CN Appl. No. 03810271.4, dated Dec. 27, 2005.
Application as filed in U.S. Appl. No. 11/378,779, filed on Mar. 17, 2006.
Preliminary Amendment filed Jul. 15, 2005 in U.S. Appl. No. 11/182,172.
Application as filed in U.S. Appl. No. 11/384,126 filed on Mar. 17, 2006.
Specification and Claims as filed in PCT/US05/39642, on Nov. 1, 2005.

* cited by examiner

US 7,189,940 B2

PLASMA-ASSISTED MELTING

CROSS-REFERENCE OF RELATED APPLICATIONS

This is a continuation-in-part of International Patent Application No. PCT/US03/14133, filed May 7, 2003, entitled "PLASMA HEATING APPARATUS AND METHODS", and claims priority to U.S. Provisional Application Nos. 60/430,677, filed Dec. 4, 2002, 60/435,278, filed Dec. 23, 2002, all of which are fully incorporated herein by reference.

FIELD OF THE INVENTION

This invention relates to methods and apparatus for plasma-assisted heating and melting, and in particular to melting metals and other solid materials.

BACKGROUND OF THE INVENTION

Blast furnaces have been used to chemically reduce and physically convert iron oxides into liquid iron. Often, the blast furnace includes a large steel stack lined with refractory brick, where iron ore, coke, and limestone are dumped into the top, and preheated air is blown into the bottom. These materials descend to the bottom of the furnace where they become the final product of liquid slag and liquid iron, which are normally drained from the furnace at regular intervals. Once a blast furnace has been started, it can continuously run for years.

The cupola plasma furnace functions similarly to a blast furnace, except that it makes molten cast iron from scrap steel or scrap substitutes. The fuel for this furnace is usually coke and often requires megawatts of plasma power. During operation, heated air is boosted in temperature with a plasma torch and blown into the bottom of the cupola. The coke can be burned creating more heat, which melts the iron. The iron can then exit the furnace and run through a trough to an iron ladle.

It is known that a plasma can be ignited by subjecting a gas to a sufficient amount of microwave radiation at reduced pressure. Vacuum equipment, however, can be expensive, slow, and energy-consuming. Moreover, the use of such equipment can limit the applications of such furnaces.

BRIEF SUMMARY OF A FEW ASPECTS OF THE INVENTION

Consistent with the present invention, plasma heating and melting apparatus and methods are provided.

In one embodiment, a plasma-assisted melting method may be provided. The method can include forming a plasma in a cavity by subjecting a first gas to electromagnetic radiation having a frequency less than about 333 GHz in the presence of a plasma catalyst, heating a second gas with the plasma, adding a solid to a melting vessel, directing the heated second gas toward the solid sufficient to at least melt the solid into a liquid, and collecting the liquid.

In another embodiment, a plasma-assisted melting method may be provided. The method can include adding a solid to a melting region, forming a plasma in a cavity by subjecting a gas to electromagnetic radiation having a frequency less than about 333 GHz in the presence of a plasma catalyst, wherein the cavity has a wall, sustaining the plasma in the cavity such that energy from the plasma passes through the wall into the melting region and melts the solid into liquid, and collecting the liquid.

In still another embodiment, a plasma-assisted melting method may include forming a plasma in a cavity by subjecting a gas to electromagnetic radiation having a frequency less than about 333 GHz in the presence of a plasma catalyst, conveying metal through the plasma until the metal melts into a molten metal, and collecting the molten metal.

Plasma catalysts, and methods and apparatus for igniting, modulating, and sustaining a plasma consistent with this invention are also provided.

BRIEF DESCRIPTION OF THE DRAWINGS

Further aspects of the invention will be apparent upon consideration of the following detailed description, taken in conjunction with the accompanying drawings, in which like reference characters refer to like parts throughout, and in which.

DETAILED DESCRIPTION OF THE EMBODIMENTS

Figure 1:
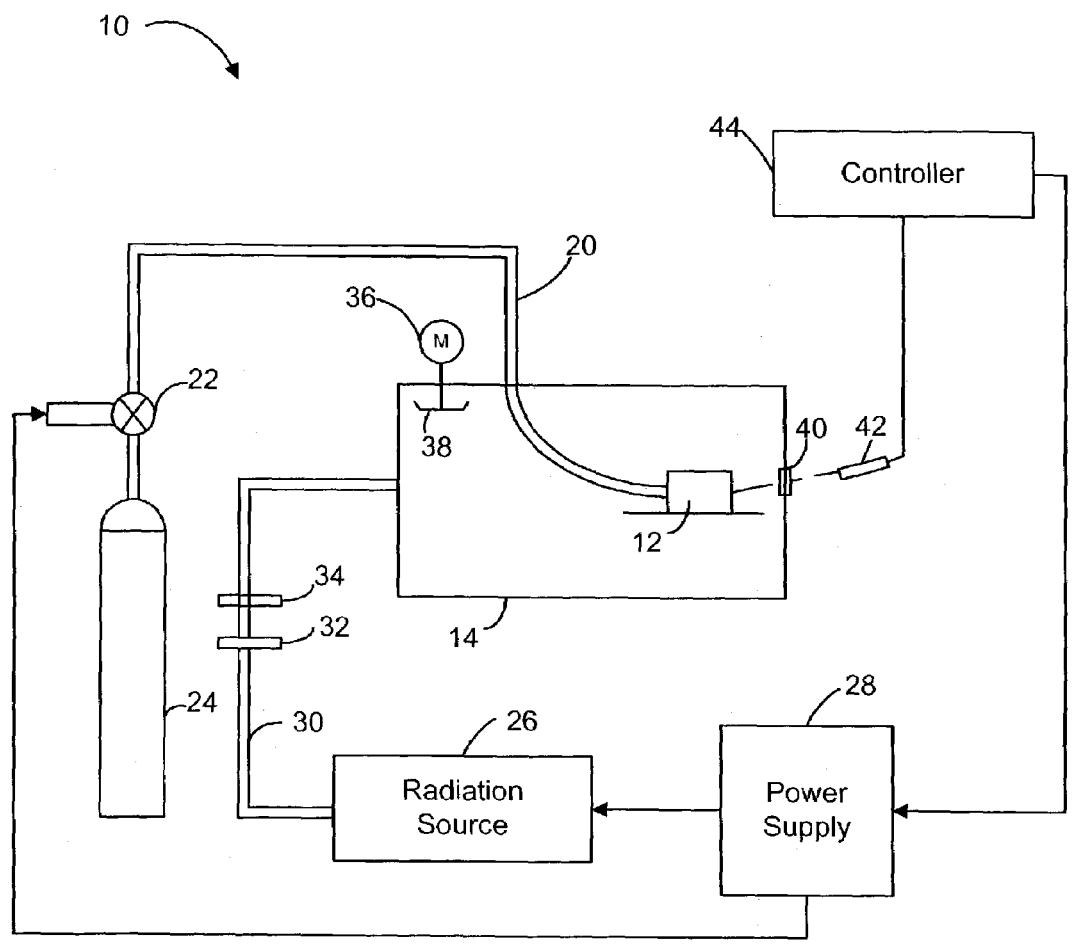
FIG. 1 shows a schematic diagram of an illustrative apparatus consistent with this invention.

Consistent with the present invention, systems and methods for plasma-assisted heating and melting are provided. As described more fully below, any type of matter (e.g., solid, fluid, or gas) can be heated by modulating or sustaining a plasma in a cavity, optionally with a plasma catalyst. In one embodiment, the cavity may have a radiation-transmissive wall and a thermally conductive wall. A plasma can be formed in the cavity by irradiating a gas located in the cavity with electromagnetic radiation. As the temperature of the plasma rises, radiative energy absorbed by the plasma can be transferred, in the form of thermal energy, to the matter (in an adjacent chamber, for example) through the thermally conductive wall. In one embodiment, a radiation source, such as a microwave radiation source, may direct radiation at the gas.

It will be appreciated that multiple radiation sources may be used consistent with this invention, such as described in commonly owned U.S. patent application Ser. No. 10/430, 415, filed May 7, 2003, which is hereby incorporated by reference in its entirety. Thus, this invention can be used for controllably generating heat and for plasma-assisted melting with lower energy costs and increased efficiency.

Plasma catalysts for initiating, modulating, and sustaining a plasma are also provided. A catalyst can be passive or active. A passive plasma catalyst can include any object capable of inducing a plasma by deforming a local electric field (e.g., an electromagnetic field) consistent with this invention without necessarily adding additional energy through the catalyst, such as by applying a voltage to create a spark. An active plasma catalyst, on the other hand, may be any particle or high energy wave packet capable of transferring a sufficient amount of energy to a gaseous atom or molecule to remove at least one electron from the gaseous atom or molecule, in the presence of electromagnetic radiation.

The following commonly owned, patent applications, filed May 7, 2003, are also hereby incorporated by reference in their entireties: PCT Patent Application No. PCT/US03/ 14037, subsequently filed on Nov. 3, 2004 as U.S. patent application Ser. No. 10/513,221, PCT Patent Application No. PCT/(US03/14124, subsequently file on Nov. 4, 2004 as U.S. patent application Ser. No. 10/513,393, PCT Patent Application No. PCT/US03/14025, subsequently filed on Nov. 4, 2004 as U.S. patent application Ser. No. 10/513,394, PCT Patent Application No. PCT/US03/14054, subsequently filed on Nov. 3, 2004 as U.S. patent application Ser. No. 10/513,305, PCT Patent Application No. PCT/US03/ 14036, subsequently filed on Nov. 5, 2004 as U.S. patent application Ser. No. 10/513,607, Ser. No. 10/430,414, now issued as U.S. Patent No. 6,870,124, PCT Patent Application No. PCT/US03/14034, Ser. No. 10/430,416 PCT Patent Application No. PCT/US03/14035, subsequently filed on Nov. 5, 2004 as U.S. patent application Ser. No. 10/513,606, PCT Patent Application No. PCT/US03/14040, subsequently filed on Nov. 3, 2004 as U.S. patent application Ser. No. 10/513,309, PCT Patent Application No. PCT/US03/ 14134, subsequently filed on Nov. 3, 2004 as U.S. patent application Ser. No. 10/513,220, PCT Patent Application No. PCT/US03/14122, PCT Patent Application No. PCT/ US03/14055, subsequently filed on Nov. 5, 2004 as U.S. patent application Ser. No. 10/513,605, PCT Patent Application No. PCT/US03/14137, Ser. No. 10/430426 PCT Patent Application No. PCT/US03/14121, PCT Patent Application No. PCT/US03/14136, subsequently filed on Nov. 5, 2004 as U.S. patent application Ser. No. 10/513,604.

Illustrative Plasma Furnace

FIG. 1 shows illustrative plasma system 10 consistent with one aspect of this invention. In this embodiment, cavity 12 is formed in a vessel that is positioned inside radiation chamber (i.e., applicator) 14. In another embodiment (not shown), vessel 12 and radiation chamber 14 are the same, thereby eliminating the need for two separate components. The vessel in which cavity 12 is formed can include one or more radiation-transmissive insulating layers to improve its thermal insulation properties without significantly shielding cavity 12 from the radiation.

In one embodiment, cavity 12 is formed in a vessel made of ceramic. Due to the extremely high temperatures that can be achieved with plasmas consistent with this invention, a ceramic capable of operating at about 3,000 degrees Fahrenheit can be used. The ceramic material can include, by weight, 29.8% silica, 68.2% alumina, 0.4% ferric oxide, 1% titania, 0.1% lime, 0.1% magnesia, 0.4% alkalies, which is sold under Model No. LW-30 by New Castle Refractories Company, of New Castle, Pa. It will be appreciated by those of ordinary skill in the art, however, that other materials, such as quartz, and those different from the one described above, can also be used consistent with the invention. It will also be appreciated that because the furnace operating temperature can be different for different types of applications, the material used to make the vessel may only need to withstand temperatures substantially below 3,000 degrees Fahrenheit, such as about 2,500 degrees, or about 1,000 degrees Fahrenheit, or even lower.

In one embodiment, a plasma was formed in a partially open cavity inside a first brick and topped with a second brick. The cavity had dimensions of about 2 inches by about 2 inches by about 1.5 inches. At least two holes were also provided in the brick in communication with the cavity: one for viewing the plasma and at least one hole for providing the gas. The size of the cavity can depend on the desired plasma process being performed. Also, for some applications, the cavity can be configured to prevent the plasma from rising/floating away from the primary heating region.

Cavity 12 can be connected to one or more gas sources 24 (e.g., a source of argon, nitrogen, hydrogen, xenon, krypton) by line 20 and control valve 22, which may be powered by power supply 28 or any other supply. Line 20 may be tubing (e.g., between about 1/16 inch and about 1/4 inch, such as about 1/8"), but can be any channel or device capable of supplying a gas to cavity 12. Also, if desired, a vacuum pump (not shown) can be connected to chamber 14 to remove any undesirable fumes that may be generated during plasma processing.

A radiation leak detector (not shown) can be installed near source 26 and waveguide 30 and connected to a safety interlock system to automatically turn off the radiation (e.g., microwave) power supply if a leak above a predefined safety limit, such as one specified by the FCC and/or OSHA (e.g., 5 mW/cm$^2$), was detected.

In one embodiment, the radiation apparatus may include radiation source 26 for directing radiation into the cavity. The radiation apparatus may further include other radiation sources (not shown) for directing additional radiation into the cavity. Radiation source 26, which may be powered by electrical power supply 28, can direct radiation into chamber 14 through one or more waveguides 30. It will be appreciated by those of ordinary skill in the art that source 26 can be connected directly to chamber 14 or cavity 12, thereby eliminating waveguides 30. The radiation energy entering cavity 12 can be used to ignite a plasma within the cavity. This plasma can be modulated or substantially sustained and confined to the cavity by coupling additional radiation with the catalyst.

Radiation source 26 may be a magnetron, a klystron, a gyrotron, a traveling-wave tube amplifier, or any other device capable of generating radiation. Radiation having any frequency less than about 333 GHz can be used consistent with this invention. For example, frequencies, such as power line frequencies (about 50 Hz to about 60 Hz), can be used, although the pressure of the gas from which the plasma is formed may be lowered to assist with plasma ignition. Also, any radio frequency or microwave frequency can be used consistent with this invention, including frequencies greater than about 100 kHz. In most cases, the gas pressure for such relatively high frequencies need not be lowered to ignite, modulate, or sustain a plasma, thereby enabling many plasma-processes to occur over a broad range of pressures, including atmospheric pressure and above.

For example, the invention may be practiced by employing microwave sources at both 915 MHz and 2.45 GHz provided by Communications and Power Industries (CPI), although radiation having any frequency less than about 333 GHz can be used. A 3-stub tuner may allow impedance matching for maximum power transfer and a dual directional coupler may be used to measure forward and reflected powers.

Radiation energy can be supplied by radiation source 26 through circulator 32 and tuner 34 (e.g., 3-stub tuner). Tuner 34 can be used to minimize the reflected power as a function of changing ignition or processing conditions, especially before the plasma has formed because microwave power, for example, will be strongly absorbed by the plasma, although the use of a circulator and a tuner is optional.

As explained more fully below, the location of radiation-transmissive cavity 12 in chamber 14 may not be critical if chamber 14 supports multiple modes, and especially when the modes are continually or periodically mixed. As also explained more fully below, motor 36 can be connected to mode-mixer 38 for making the time-averaged radiation energy distribution substantially uniform throughout chamber 14. Furthermore, window 40 (e.g., a quartz window) can be disposed in one wall of chamber 14 adjacent to cavity 12, permitting temperature sensor 42 (e.g., an optical pyrometer) to be used to view a process inside cavity 12. In one embodiment, the optical pyrometer output can increase from zero volts as the temperature rises to within the tracking range.

Sensor 42 can develop output signals as a function of the temperature or any other monitorable condition associated with a work piece (not shown) within cavity 12 and provide the signals to controller 44. Dual temperature sensing and heating, as well as automated cooling gas flow control, can also be used. Controller 44 in turn can be used to control operation of power supply 28, which can have one output connected to source 26 as described above and another output connected to valve 22 to control gas flow into cavity 12.

The equipment may be computer controlled using Lab View 6$i$ software, which may provide real-time temperature monitoring and microwave power control. Noise may be reduced by using sliding averages of suitable number of data points. Also, by using shift registers and buffer sizing the number of stored data points in the array may be limited to improve speed and computational efficiency. The pyrometer may measure the temperature of a sensitive area of about 1 cm.sup.2, which may be used to calculate an average temperature. The pyrometer may sense radiant intensities at two wavelengths and fit those intensities using Planck's law to determine the temperature. It will be appreciated, however, that other devices and methods for monitoring and controlling temperature are also available and can be used consistent with this invention. Control software that can be used consistent with this invention is described, for example, in commonly owned PCT Patent Application No. PCT/US03/14135, filed May 7, 2003, which is hereby incorporated by reference in its entirety.

Chamber 14 may have several glass-covered viewing ports with radiation shields and a quartz window for pyrometer access. Several ports for connection to a vacuum pump and a gas source may also be provided, although not necessarily used.

The exemplary furnace may also include a closed-loop deionized water cooling system (not shown) with an external heat exchanger cooled by tap water. During operation, the deionized water may first cool the magnetron, then the load-dump in the circulator (used to protect the magnetron), and finally the radiation chamber through water channels welded on the outer surface of the chamber.

Plasma Catalysts

A plasma catalyst consistent with this invention can include one or more different materials and may be either passive or active. A plasma catalyst can be used, among other things, to ignite, modulate, and/or sustain a plasma at a gas pressure that is less than, equal to, or greater than atmospheric pressure.

One method of forming a plasma consistent with this invention can include subjecting a gas in a cavity to electromagnetic radiation having a frequency less than about 333 GHz in the presence of a passive plasma catalyst. A passive plasma catalyst consistent with this invention can include any object capable of inducing a plasma by deforming a local electric field (e.g., an electromagnetic field) consistent with this invention, without necessarily adding additional energy through the catalyst, such as by applying an electric voltage to create a spark.

A passive plasma catalyst consistent with this invention can also be a nano-particle or a nano-tube. As used herein, the term "nano-particle" can include any particle having a maximum physical dimension less than about 100 nm that is at least electrically semi-conductive. Also, both single-walled and multi-walled carbon nanotubes, doped and undoped, can be particularly effective for igniting plasmas consistent with this invention because of their exceptional electrical conductivity and elongated shape. The nanotubes can have any convenient length and can be a powder fixed to a substrate. If fixed, the nanotubes can be oriented randomly on the surface of the substrate or fixed to the substrate (e.g., at some predetermined orientation) while the plasma is ignited or sustained.

A passive plasma catalyst can also be a powder consistent with this invention, and need not comprise nano-particles or nano-tubes. It can be formed, for example, from fibers, dust particles, flakes, sheets, etc. When in powder form, the catalyst can be suspended, at least temporarily, in a gas. By suspending the powder in the gas, the powder can be quickly dispersed throughout the cavity and more easily consumed, if desired.

Figure 2:
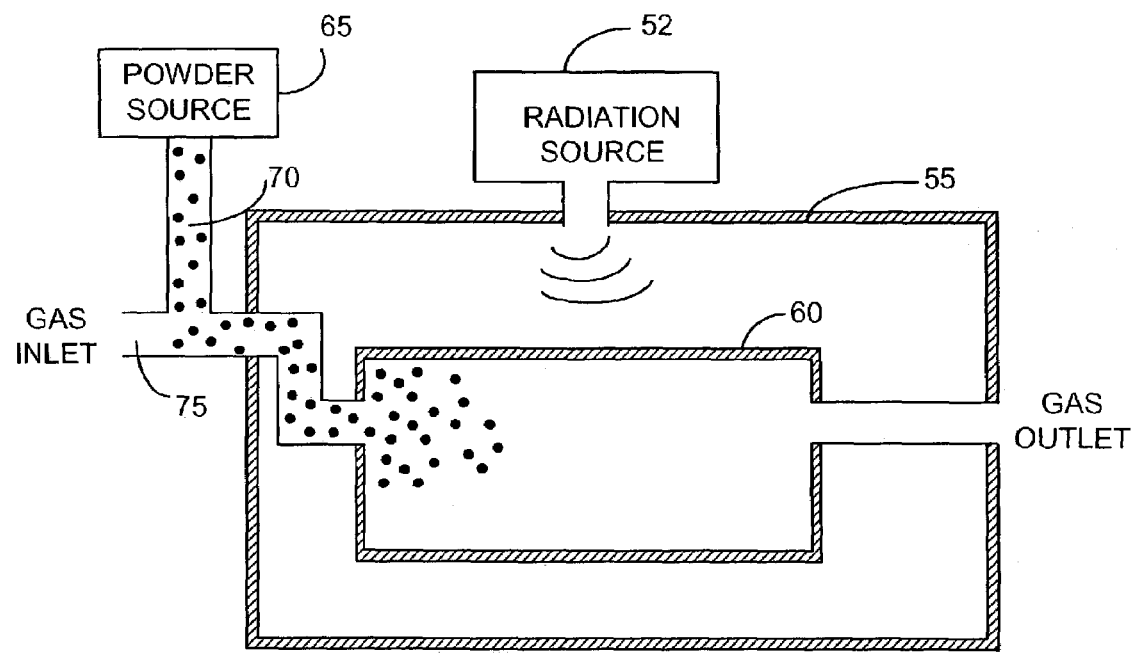
FIG. 2 shows an illustrative embodiment of a portion of a plasma system for adding a powder plasma catalyst to a plasma cavity for igniting, modulating, or sustaining a plasma in a cavity consistent with this invention.

In one embodiment, a powder catalyst can be carried into the cavity and at least temporarily suspended with a carrier gas. The carrier gas can be the same or different from the gas that forms the plasma. Also, the powder can be added to the gas prior to being introduced to the cavity. For example, as shown in FIG. 2, radiation source 52 can supply radiation to radiation cavity 55, in which plasma cavity 60 is placed. Powder source 65 can provide catalytic powder 70 into gas stream 75. In an alternative embodiment, powder 70 can be first added to cavity 60 in bulk (e.g., in a pile) and then distributed in the cavity in any number of ways, including flowing a gas through or over the bulk powder. In addition, the powder can be added to the gas for igniting, modulating, or sustaining a plasma by moving, conveying, drizzling, sprinkling, blowing, or otherwise, feeding the powder into or within the cavity.

In one experiment, a plasma was ignited in a cavity by placing a pile of carbon fiber powder in a copper pipe that extended into the cavity. Although sufficient radiation was directed into the cavity, the copper pipe shielded the powder from the radiation and no plasma ignition took place. However, once a carrier gas began flowing through the pipe, forcing the powder out of the pipe and into the cavity, and thereby subjecting the powder to the radiation, a plasma was nearly instantaneously ignited in the cavity.

A powder plasma catalyst consistent with this invention can be substantially non-combustible, thus it need not contain oxygen or burn in the presence of oxygen. Thus, as mentioned above, the catalyst can include a metal, carbon, a carbon-based alloy, a carbon-based composite, an electrically conductive polymer, a conductive silicone elastomer, a polymer nanocomposite, an organic-inorganic composite, and any combination thereof.

Also, powder catalysts can be substantially uniformly distributed in the plasma cavity (e.g., when suspended in a gas), and plasma ignition can be precisely controlled within the cavity. Uniform ignition can be important in certain applications, including those applications requiring brief plasma exposures, such as in the form of one or more bursts. Still, a certain amount of time can be required for a powder catalyst to distribute itself throughout a cavity, especially in complicated, multi-chamber cavities. Therefore, consistent with another aspect of this invention, a powder catalyst can be introduced into the cavity through a plurality of ignition ports to more rapidly obtain a more uniform catalyst distribution therein (see below).

In addition to powder, a passive plasma catalyst consistent with this invention can include, for example, one or more microscopic or macroscopic fibers, sheets, needles, threads, strands, filaments, yarns, twines, shavings, slivers, chips, woven fabrics, tape, whiskers, or any combination thereof. In these cases, the plasma catalyst can have at least one portion with one physical dimension substantially larger than another physical dimension. For example, the ratio between at least two orthogonal dimensions should be at least about 1:2, but could be greater than about 1:5, or even greater than about 1:10.

Thus, a passive plasma catalyst can include at least one portion of material that is relatively thin compared to its length. A bundle of catalysts (e.g., fibers) may also be used and can include, for example, a section of graphite tape. In one experiment, a section of tape having approximately thirty thousand strands of graphite fiber, each about 2–3 microns in diameter, was successfully used. The number of fibers in and the length of a bundle are not critical to igniting, modulating, or sustaining the plasma. For example, satisfactory results have been obtained using a section of graphite tape about one-quarter inch long. One type of carbon fiber that has been successfully used consistent with this invention is sold under the trademark Magnamite®, Model No. AS4C-GP3K, by the Hexcel Corporation, of Anderson, S. C. Also, silicon-carbide fibers have been successfully used.

A passive plasma catalyst consistent with another aspect of this invention can include one or more portions that are, for example, substantially spherical, annular, pyramidal, cubic, planar, cylindrical, rectangular or elongated.

The passive plasma catalysts discussed above include at least one material that is at least electrically semi-conductive. In one embodiment, the material can be highly conductive. For example, a passive plasma catalyst consistent with this invention can include a metal, an inorganic material, carbon, a carbon-based alloy, a carbon-based composite, an electrically conductive polymer, a conductive silicone elastomer, a polymer nanocomposite, an organic-inorganic composite, or any combination thereof. Some of the possible inorganic materials that can be included in the plasma catalyst include carbon, silicon carbide, molybdenum, platinum, tantalum, tungsten, carbon nitride, and aluminum, although other electrically conductive inorganic materials are believed to work just as well.

In addition to one or more electrically conductive materials, a passive plasma catalyst consistent with this invention can include one or more additives (which need not be electrically conductive). As used herein, the additive can include any material that a user wishes to add to the plasma. For example, in doping semiconductors and other materials, one or more dopants can be added to the plasma through the catalyst. See, e.g., commonly owned PCT Patent Application No. PCT/US03/14130 filed May 7, 2003, subsequently filed on Nov. 4, 2005 as U.S. patent application Ser. No. 10/513,397, which is hereby incorporated by reference in its entirety. The catalyst can include the dopant itself, or it can include a precursor material that, upon decomposition, can form the dopant. Thus, the plasma catalyst can include one or more additives and one or more electrically conductive materials in any desirable ratio, depending on the ultimate desired composition of the plasma and the process using the plasma.

The ratio of the electrically conductive components to the additives in a passive plasma catalyst can vary over time while being consumed. For example, during ignition, the plasma catalyst could desirably include a relatively large percentage of electrically conductive components to improve the ignition conditions. On the other hand, if used while modulating or sustaining the plasma, the catalyst could include a relatively large percentage of additives. It will be appreciated by those of ordinary skill in the art that the component ratio of the plasma catalyst used to ignite, modulate, and/or sustain the plasma could be the same.

A predetermined ratio profile can be used to simplify many plasma processes. In many conventional plasma processes, the components within the plasma are added as necessary, but such addition normally requires programmable equipment to add the components according to a predetermined schedule. However, consistent with this invention, the ratio of components in the catalyst can be varied, and thus the ratio of components in the plasma itself can be automatically varied. That is, the ratio of components in the plasma at any particular time can depend on which of the catalyst portions is currently being consumed by the plasma. Thus, the catalyst component ratio can be different at different locations within the catalyst. And, the current ratio of components in a plasma can depend on the portions of the catalyst currently and/or previously consumed, especially when the flow rate of a gas passing through the plasma chamber is relatively slow.

Figure 3:
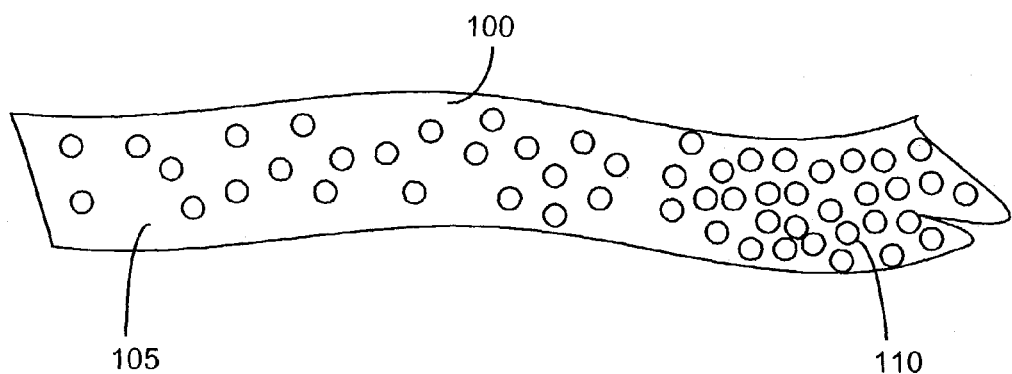
FIG. 3 shows an illustrative plasma catalyst fiber with at least one component having a concentration gradient along its length consistent with this invention.

A passive plasma catalyst consistent with this invention can be homogeneous, inhomogeneous, or graded. Also, the plasma catalyst component ratio can vary continuously or discontinuously throughout the catalyst. For example, in FIG. 3, the ratio can vary smoothly forming a gradient along a length of catalyst 100. Catalyst 100 can include a strand of material that includes a relatively low concentration of a component at section 105 and a continuously increasing concentration toward section 110.

Figure 4:
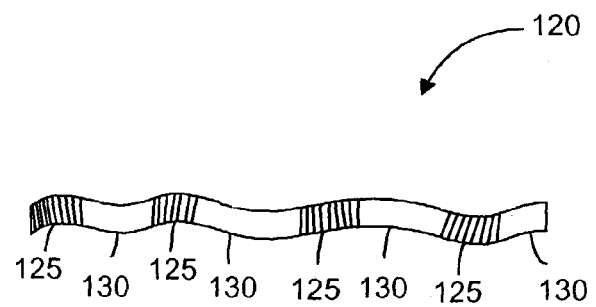
FIG. 4 shows an illustrative plasma catalyst fiber with multiple components at a ratio that varies along its length consistent with this invention.

Alternatively, as shown in FIG. 4, the ratio can vary discontinuously in each portion of catalyst 120, which includes, for example, alternating sections 125 and 130 having different concentrations. It will be appreciated that catalyst 120 can have more than two section types. Thus, the catalytic component ratio being consumed by the plasma can vary in any predetermined fashion. In one embodiment, when the plasma is monitored and a particular additive is detected, further processing can be automatically commenced or terminated.

Another way to vary the ratio of components in a sustained plasma is by introducing multiple catalysts having different component ratios at different times or different rates. For example, multiple catalysts can be introduced at approximately the same location or at different locations within the cavity. When introduced at different locations, the plasma formed in the cavity can have a component concentration gradient determined by the locations of the various catalysts. Thus, an automated system can include a device by which a consumable plasma catalyst is mechanically inserted before and/or during plasma igniting, modulating, and/or sustaining.

Figure 5A:
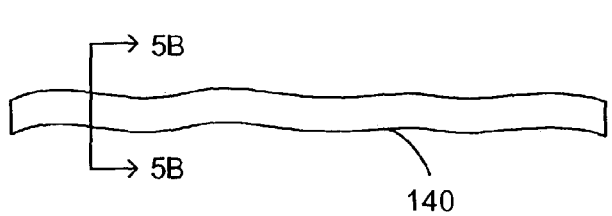
FIG. 5A shows another illustrative plasma catalyst fiber that includes a core underlayer and a coating consistent with this invention.
Figure 5B:
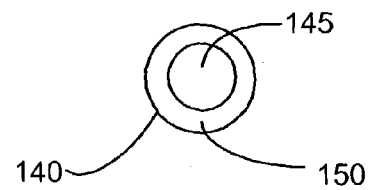
FIG. 5B shows a cross-sectional view of the plasma catalyst fiber of FIG. 5A, taken from line 5B—5B of FIG. 5A, consistent with this invention.

A passive plasma catalyst consistent with this invention can also be coated. In one embodiment, a catalyst can include a substantially non-electrically conductive coating deposited on the surface of a substantially electrically conductive material. Alternatively, the catalyst can include a substantially electrically conductive coating deposited on the surface of a substantially electrically non-conductive material. FIGS. 5A and 5B, for example, show fiber 140, which includes underlayer 145 and coating 150. In one embodiment, a plasma catalyst including a carbon core is coated with nickel to prevent oxidation of the carbon.

A single plasma catalyst can also include multiple coatings. If the coatings are consumed during contact with the plasma, the coatings could be introduced into the plasma sequentially, from the outer coating to the innermost coating, thereby creating a time-release mechanism. Thus, a coated plasma catalyst can include any number of materials, as long as a portion of the catalyst is at least electrically semi-conductive.

Consistent with another embodiment of this invention, a plasma catalyst can be located entirely within a radiation cavity to substantially reduce or prevent radiation energy leakage. In this way, the plasma catalyst does not electrically or magnetically couple with the vessel containing the cavity or to any electrically conductive object outside the cavity. This prevents sparking at the ignition port and prevents radiation from leaking outside the cavity during the ignition and possibly later if the plasma is sustained. In one embodiment, the catalyst can be located at a tip of a substantially electrically non-conductive extender that extends through an ignition port.

Figure 6:
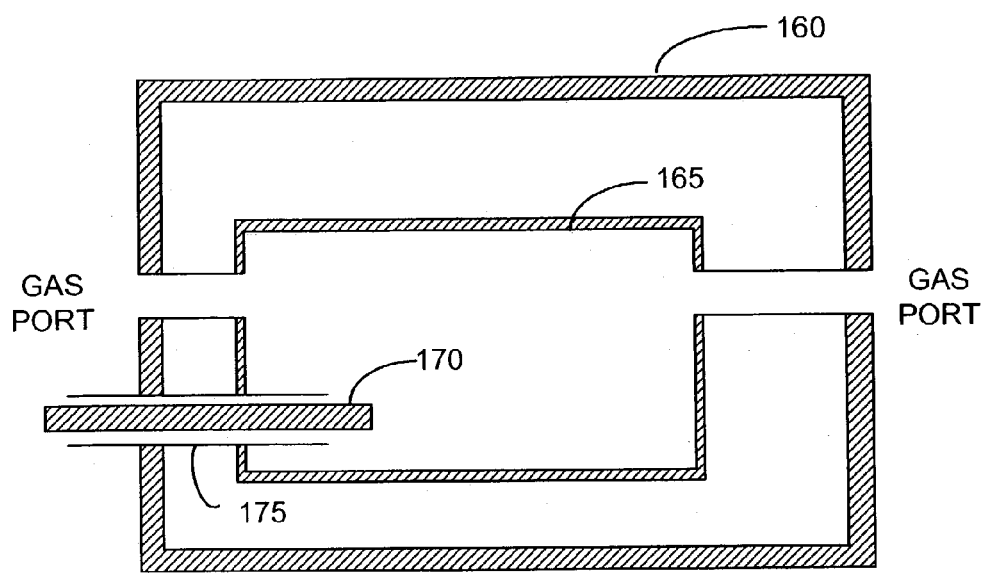
FIG. 6 shows an illustrative embodiment of another portion of a plasma system including an elongated plasma catalyst that extends through ignition port consistent with this invention.
Figure 7:
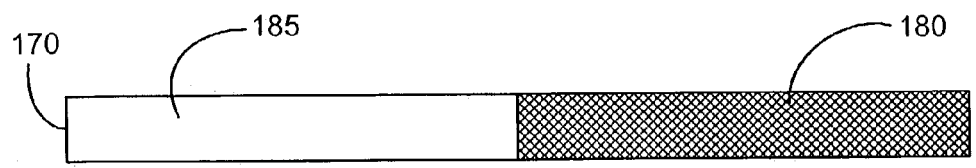
FIG. 7 shows an illustrative embodiment of an elongated plasma catalyst that can be used in the system of FIG. 6 consistent with this invention.

FIG. 6, for example, shows radiation chamber 160 in which plasma cavity 165 is placed. Plasma catalyst 170 is elongated and extends through ignition port 175. As shown in FIG. 7, and consistent with this invention, catalyst 170 can include electrically conductive distal portion 180 (which is placed in chamber 160) and electrically non-conductive portion 185 (which is placed substantially outside chamber 160). This configuration prevents an electrical connection (e.g., sparking) between distal portion 180 and chamber 160.

Figure 8:
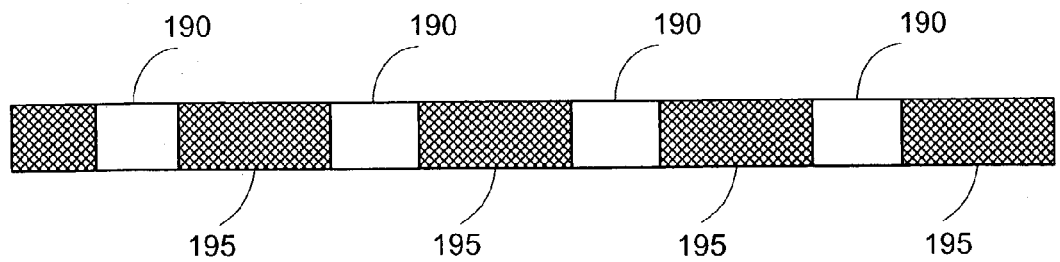
FIG. 8 shows another illustrative embodiment of an elongated plasma catalyst that can be used in the system of FIG. 6 consistent with this invention.

In another embodiment, shown in FIG. 8, the catalyst can be formed from a plurality of electrically conductive segments 190 separated by and mechanically connected to a plurality of electrically non-conductive segments 195. In this embodiment, the catalyst can extend through the ignition port between a point inside the cavity and another point outside the cavity, but the electrically discontinuous profile significantly prevents sparking and energy leakage.

Another method of forming a plasma consistent with this invention includes subjecting a gas in a cavity to electromagnetic radiation having a frequency less than about 333 GHz in the presence of an active plasma catalyst, which generates or includes at least one ionizing particle.

An active plasma catalyst consistent with this invention can be any particle or high energy wave packet capable of transferring a sufficient amount of energy to a gaseous atom or molecule to remove at least one electron from the gaseous atom or molecule in the presence of electromagnetic radiation. Depending on the source, the ionizing particles can be directed into the cavity in the form of a focused or collimated beam, or they may be sprayed, spewed, sputtered, or otherwise introduced.

Figure 9:
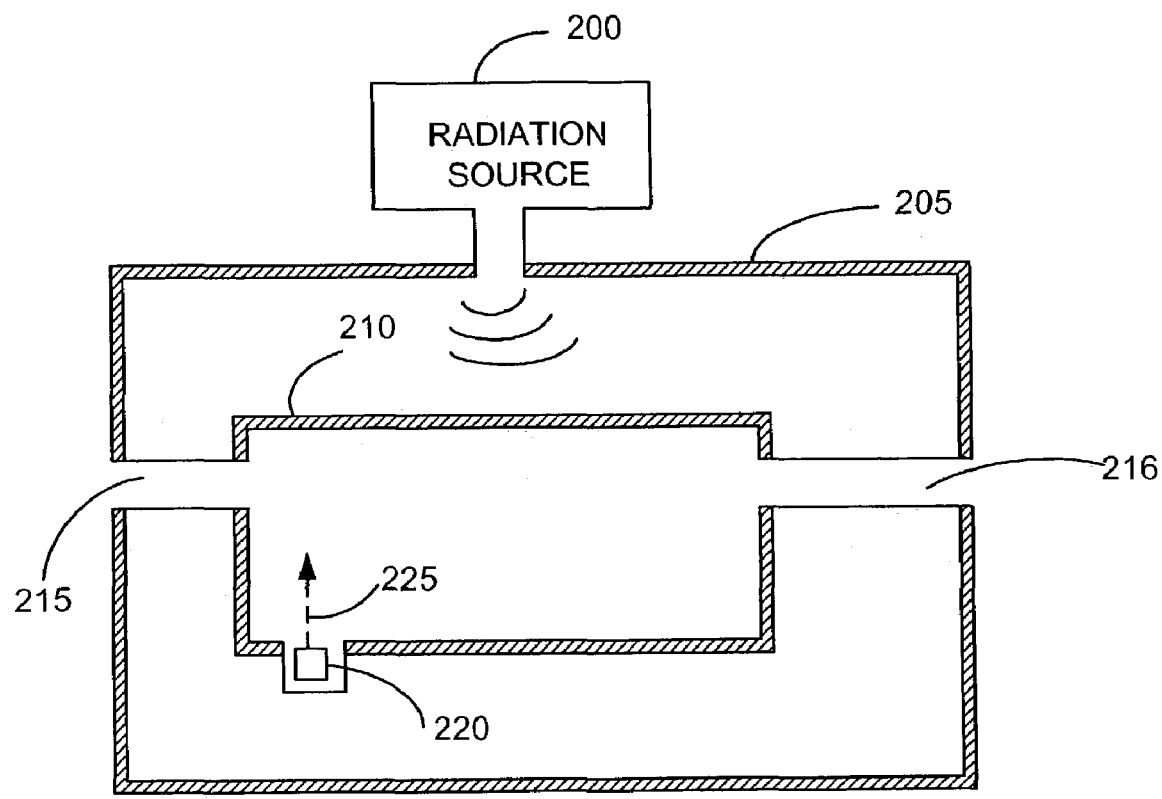
FIG. 9 shows an illustrative embodiment of a portion of a plasma system for directing ionizing radiation into a radiation chamber consistent with this invention.

For example, FIG. 9 shows radiation source 200 directing radiation into radiation chamber 205. Plasma cavity 210 can be positioned inside of chamber 205 and may permit a gas to flow therethrough via its gas ports. Source 220 directs ionizing particles 225 into cavity 210. Source 220 can be protected, for example, by a metallic screen which allows the ionizing particles to pass through but shields source 220 from radiation. If necessary, source 220 can be water-cooled.

Examples of ionizing particles consistent with this invention can include x-ray particles, gamma ray particles, alpha particles, beta particles, neutrons, protons, and any combination thereof. Thus, an ionizing particle catalyst can be charged (e.g., an ion from an ion source) or uncharged and can be the product of a radioactive fission process. In one embodiment, the vessel in which the plasma cavity is formed could be entirely or partially transmissive to the ionizing particle catalyst. Thus, when a radioactive fission source is located outside the cavity, the source can direct the fission products through the vessel to ignite the plasma. The radioactive fission source can be located inside the radiation chamber to substantially prevent the fission products (i.e., the ionizing particle catalyst) from creating a safety hazard.

In another embodiment, the ionizing particle can be a free electron, but it need not be emitted in a radioactive decay process. For example, the electron can be introduced into the cavity by energizing the electron source (such as a metal), such that the electrons have sufficient energy to escape from the source. The electron source can be located inside the cavity, adjacent the cavity, or even in the cavity wall. It will be appreciated by those of ordinary skill in the art that the any combination of electron sources is possible. A common way to produce electrons is to heat a metal, and these electrons can be further accelerated by applying an electric field.

In addition to electrons, free energetic protons can also be used to catalyze a plasma. In one embodiment, a free proton can be generated by ionizing hydrogen and, optionally, accelerated with an electric field.

Multi-Mode Radiation Cavities

A radiation waveguide, cavity, or chamber can be designed to support or facilitate propagation of at least one electromagnetic radiation mode. As used herein, the term "mode" refers to a particular pattern of any standing or propagating electromagnetic wave that satisfies Maxwell's equations and the applicable boundary conditions (e.g., of the cavity). In a waveguide or cavity, the mode can be any one of the various possible patterns of propagating or standing electromagnetic fields. Each mode is characterized by its frequency and polarization of the electric field and/or the magnetic field vectors. The electromagnetic field pattern of a mode depends on the frequency, refractive indices or dielectric constants, and waveguide or cavity geometry.

A transverse electric (TE) mode is one whose electric field vector is normal to the direction of propagation. Similarly, a transverse magnetic (TM) mode is one whose magnetic field vector is normal to the direction of propagation. A transverse electric and magnetic (TEM) mode is one whose electric and magnetic field vectors are both normal to the direction of propagation. A hollow metallic waveguide does not typically support a normal TEM mode of radiation propagation. Even though radiation appears to travel along the length of a waveguide, it may do so only by reflecting off the inner walls of the waveguide at some angle. Hence, depending upon the propagation mode, the radiation (e.g., microwave) may have either some electric field component or some magnetic field component along the axis of the waveguide (often referred to as the z-axis).

The actual field distribution inside a cavity or waveguide is a superposition of the modes therein. Each of the modes can be identified with one or more subscripts (e.g., $TE_{10}$ ("tee ee one zero"). The subscripts normally specify how many "half waves" at the guide wavelength are contained in the x and y directions. It will be appreciated by those skilled in the art that the guide wavelength can be different from the free space wavelength because radiation propagates inside the waveguide by reflecting at some angle from the inner walls of the waveguide. In some cases, a third subscript can be added to define the number of half waves in the standing wave pattern along the z-axis.

For a given radiation frequency, the size of the waveguide can be selected to be small enough so that it can support a single propagation mode. In such a case, the system is called a single-mode system (i.e., a single-mode applicator). The $TE_{10}$ mode is usually dominant in a rectangular single-mode waveguide.

As the size of the waveguide (or the cavity to which the waveguide is connected) increases, the waveguide or applicator can sometimes support additional higher order modes forming a multi-mode system. When many modes are capable of being supported simultaneously, the system is often referred to as highly moded.

A simple, single-mode system has a field distribution that includes at least one maximum and/or minimum. The magnitude of a maximum largely depends on the amount of radiation supplied to the system. Thus, the field distribution of a single mode system is strongly varying and substantially non-uniform.

Unlike a single-mode cavity, a multi-mode cavity can support several propagation modes simultaneously, which, when superimposed, results in a complex field distribution pattern. In such a pattern, the fields tend to spatially smear and, thus, the field distribution usually does not show the same types of strong minima and maxima field values within the cavity. In addition, as explained more fully below, a mode-mixer can be used to "stir" or "redistribute" modes (e.g., by mechanical movement of a radiation reflector). This redistribution desirably provides a more uniform time-averaged field distribution within the cavity.

A multi-mode cavity consistent with this invention can support at least two modes, and may support many more than two modes. Each mode has a maximum electric field vector. Although there may be two or more modes, one mode may be dominant and has a maximum electric field vector magnitude that is larger than the other modes. As used herein, a multi-mode cavity may be any cavity in which the ratio between the first and second mode magnitudes is less than about 1:10, or less than about 1:5, or even less than about 1:2. It will be appreciated by those of ordinary skill in the art that the smaller the ratio, the more distributed the electric field energy between the modes, and hence the more distributed the radiation energy is in the cavity.

The distribution of plasma within a processing cavity may strongly depend on the distribution of the applied radiation. For example, in a pure single mode system, there may only be a single location at which the electric field is a maximum. Therefore, a strong plasma may only form at that single location. In many applications, such a strongly localized plasma could undesirably lead to non-uniform plasma treatment or heating (i.e., localized overheating and underheating).

Whether or not a single or multi-mode cavity is used consistent with this invention, it will be appreciated by those of ordinary skill in the art that the cavity in which the plasma is formed can be completely closed or partially open. For example, in certain applications, such as in plasma-assisted furnaces, the cavity could be entirely closed. In other applications, however, it may be desirable to flow a gas through the cavity, and therefore the cavity must be open to some degree. In this way, the flow, type, and pressure of the flowing gas can be varied over time. This may be desirable because certain gases that facilitate plasma formation, such as argon, are easier to ignite but may not be needed during subsequent plasma processing.

Mode-mixing

For many applications, a cavity containing a uniform plasma is desirable. However, because radiation can have a relatively long wavelength (e.g., several tens of centimeters), obtaining a uniform distribution can be difficult to achieve. As a result, consistent with one aspect of this invention, the radiation modes in a multi-mode cavity can be mixed, or redistributed, over a period of time. Because the field distribution within the cavity must satisfy all of the boundary conditions set by the inner surface of the cavity, those field distributions can be changed by changing the position of any portion of that inner surface.

In one embodiment consistent with this invention, a movable reflective surface can be located inside the radiation cavity. The shape and motion of the reflective surface should, when combined, change the inner surface of the cavity during motion. For example, an "L" shaped metallic object (i.e., "mode-mixer") when rotated about any axis will change the location or the orientation of the reflective surfaces in the cavity and therefore change the radiation distribution therein. Any other asymmetrically shaped object can also be used (when rotated), but symmetrically shaped objects can also work, as long as the relative motion (e.g., rotation, translation, or a combination of both) causes some change in the location or orientation of the reflective surfaces. In one embodiment, a mode-mixer can be a cylinder that is rotatable about an axis that is not the cylinder's longitudinal axis.

Each mode of a multi-mode cavity may have at least one maximum electric field vector, but each of these vectors could occur periodically across the inner dimension of the cavity. Normally, these maxima are fixed, assuming that the frequency of the radiation does not change. However, by moving a mode-mixer such that it interacts with the radiation, it is possible to move the positions of the maxima. For example, mode-mixer 38 can be used to optimize the field distribution within cavity 12 such that the plasma ignition conditions and/or the plasma sustaining conditions are optimized. Thus, once a plasma is excited, the position of the mode-mixer can be changed to move the position of the maxima for a uniform time-averaged plasma process (e.g., heating).

Thus, consistent with this invention, mode-mixing can be useful during plasma ignition. For example, when an electrically conductive fiber is used as a plasma catalyst, it is known that the fiber's orientation can strongly affect the minimum plasma-ignition conditions. It has been reported, for example, that when such a fiber is oriented at an angle that is greater than 60° to the electric field, the catalyst does little to improve, or relax, these conditions. By moving a reflective surface either in or near the cavity, however, the electric field distribution can be significantly changed.

Mode-mixing can also be achieved by launching the radiation into the applicator chamber through, for example, a rotating waveguide joint that can be mounted inside the applicator chamber. The rotary joint can be mechanically moved (e.g., rotated) to effectively launch the radiation in different directions in the radiation chamber. As a result, a changing field pattern can be generated inside the applicator chamber.

Mode-mixing can also be achieved by launching radiation in the radiation chamber through a flexible waveguide. In one embodiment, the waveguide can be mounted inside the chamber. In another embodiment, the waveguide can extend into the chamber. The position of the end portion of the flexible waveguide can be continually or periodically moved (e.g., bent) in any suitable manner to launch the radiation (e.g., microwave radiation) into the chamber at different directions and/or locations. This movement can also result in mode-mixing and facilitate more uniform plasma processing (e.g., heating) on a time-averaged basis. Alternatively, this movement can be used to optimize the location of a plasma for ignition or other plasma-assisted process.

If the flexible waveguide is rectangular, a simple twisting of the open end of the waveguide will rotate the orientation of the electric and the magnetic field vectors in the radiation inside the applicator chamber. Then, a periodic twisting of the waveguide can result in mode-mixing as well as rotating the electric field, which can be used to assist ignition, modulation, or sustaining of a plasma.

Thus, even if the initial orientation of the catalyst is perpendicular to the electric field, the redirection of the electric field vectors can change the ineffective orientation to a more effective one. Those skilled in the art will appreciate that mode-mixing can be continuous, periodic, or preprogrammed.

In addition to plasma ignition, mode-mixing can be useful during subsequent plasma-assisted processing (e.g., heating) to reduce or create (e.g., tune) "hot spots" in the chamber. When a cavity only supports a small number of modes (e.g., less than 5), one or more localized electric field maxima can lead to "hot spots" (e.g., within cavity 12). In one embodiment, these hot spots could be configured to coincide with one or more separate, but simultaneous, plasma ignitions or processing events. Thus, the plasma catalyst can be located at one or more of those ignition or subsequent processing or heating positions.

Multi-location Ignition

A plasma can be ignited using multiple plasma catalysts at different locations. In one embodiment, multiple fibers can be used to ignite the plasma at different points within the cavity. Such multi-point ignition can be especially beneficial when a uniform plasma ignition is desired. For example, when a plasma is modulated at a high frequency (i.e., tens of Hertz and higher), or ignited in a relatively large volume, or both, substantially uniform instantaneous striking and restriking of the plasma can be improved. Alternatively, when plasma catalysts are used at multiple points, they can be used to sequentially ignite a plasma at different locations within a plasma chamber by selectively introducing the catalyst at those different locations. In this way, a plasma ignition gradient can be controllably formed within the cavity, if desired.

Also, in a multi-mode cavity, random distribution of the catalyst throughout multiple locations in the cavity increases the likelihood that at least one of the fibers, or any other passive plasma catalyst consistent with this invention, is optimally oriented with the electric field lines. Still, even where the catalyst is not optimally oriented (not substantially aligned with the electric field lines), the ignition conditions are improved.

Furthermore, because a catalytic powder can be suspended in a gas, it is believed that each powder particle may have the effect of being placed at a different physical location within the cavity, thereby improving ignition uniformity within the cavity.

Dual-Cavity Plasma Igniting/Sustaining

A dual-cavity arrangement can be used to ignite and sustain a plasma consistent with this invention. In one embodiment, a system can include at least a first ignition cavity and a second cavity in fluid communication with the first cavity. To ignite a plasma, a gas in the first ignition cavity can be subjected to electromagnetic radiation having a frequency less than about 333 GHz, optionally in the presence of a plasma catalyst. In this way, the proximity of the first and second cavities may permit a plasma formed in the first cavity to ignite a plasma in the second cavity, which may be sustained with additional electromagnetic radiation.

In one embodiment of this invention, the first cavity can be very small and designed primarily, or solely for plasma ignition. In this way, very little radiation energy may be required to ignite the plasma, permitting easier ignition, especially when a plasma catalyst is used consistent with this invention.

In one embodiment, the first cavity may be a substantially single mode cavity and the second cavity is a multi-mode cavity. When the first ignition cavity only supports a single mode, the electric field distribution may strongly vary within the cavity, forming one or more precisely located electric field maxima. Such maxima are normally the first locations at which plasmas ignite, making them ideal points for placing plasma catalysts. It will be appreciated, however, that when a plasma catalyst is used, it need not be placed in the electric field maximum and, many cases, need not be oriented in any particular direction.

Illustrative Plasma-Assisted Heating and Melting

Methods and apparatus for plasma-assisted heating may be provided consistent with this invention. A plasma catalyst can be used to facilitate the igniting, modulating, or sustaining of the plasma at gas pressures below, at, or above atmospheric pressure.

Figure 10:
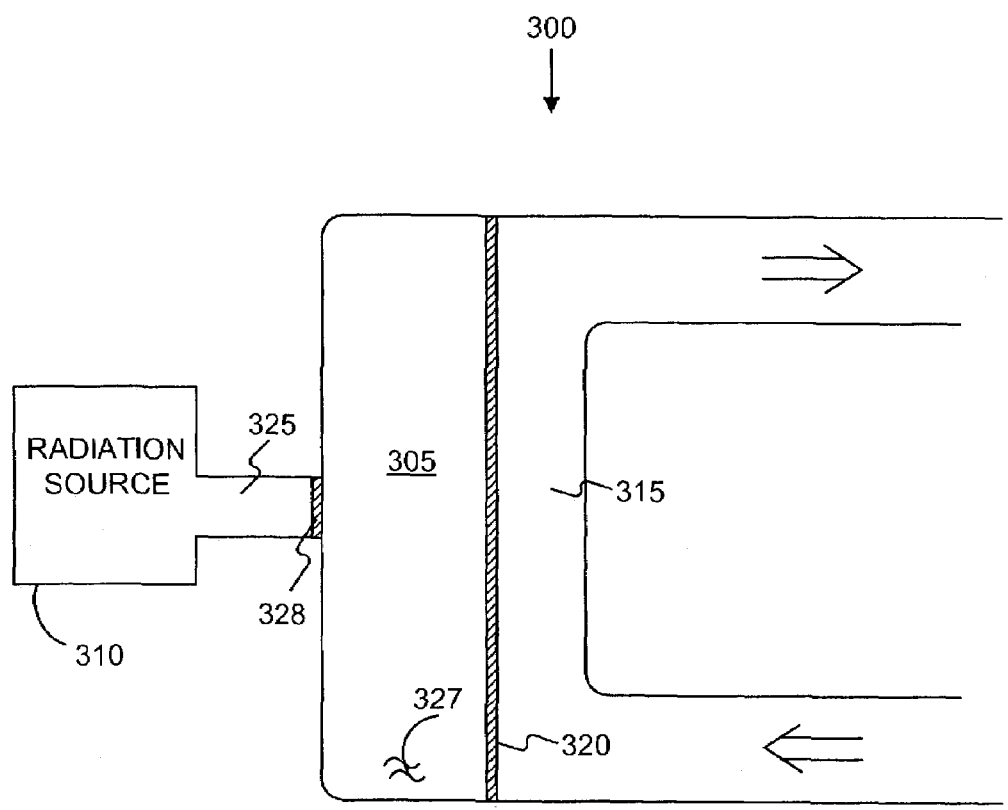
FIG. 10 shows a cross-sectional view of illustrative plasma-assisted heating apparatus consistent with this invention.

FIG. 10 shows a cross-sectional view of illustrative plasma-assisted heating apparatus 300 consistent with this invention. Apparatus 300 can include cavity 305 for containing a gas, at least one radiation source 310, and heating region 315. Radiation source 310 can be configured to irradiate a gas located in cavity 305 and to ignite, modulate, and/or sustain a plasma from the gas in cavity 305. Cavity 305 can have at least one thermally conductive wall 320 for conducting the energy absorbed by the plasma in cavity 305 to a location outside cavity 305. Heating region 315 can be located external to cavity 305 (as shown in FIG. 10) and adjacent to wall 320. A radiation-transmissive window 328 can be used to prevent the plasma from moving from cavity 305 to waveguide 325.

Radiation source 310 can be, for example, a magnetron, a klystron, a gyrotron, a traveling wave tube, a solid state microwave source, or any other radiation source capable of supplying electromagnetic radiation having a frequency less than about 333 GHz. As shown in FIG. 10, radiation source 310 can direct radiation through waveguide 325. Alternatively, radiation source can be coupled to cavity 305 using a coaxial cable selected to propagate the desired type of radiation. In another embodiment, radiation source 310 can simply direct radiation toward cavity 305 without any physical connection.

For example, as shown in FIG. 1, radiation source 26 directs radiation into chamber 14 and that radiation passes through the vessel containing cavity 12. In this case, the cavity can have a wall portion that is at least partially radiation-transmissive (e.g., ceramic, quartz, etc.). It will be appreciated that any other technique for directing radiation into a plasma cavity can also be used consistent with this invention.

When radiation source 310 is turned on, or activated, care should be taken to prevent radiation from reflecting from an inner surface of cavity 305 and reentering source 310, which could damage it. One way to prevent such damage is to use a plasma catalyst consistent with this invention. As described above, the use of a plasma catalyst can cause a plasma to ignite nearly instantaneously when radiation first enters cavity 305. Because plasma strongly absorbs electromagnetic radiation, the existence of a plasma in cavity 305 can substantially prevent radiation from reflecting back into radiation source 310 at the early stages of plasma ignition. An isolator (not shown in FIG. 10) can also be located between cavity 305 and source 310 to further prevent potentially damaging radiation from passing back to radiation source 310, if desired.

In addition, one or more radiation sources can be used to direct radiation into cavity 305 consistent with this invention. In this case, radiation generated by one radiation source can be undesirably directed into another radiation source, which can also lead to the same type of damage due to reflected power. Once again, the use of a plasma catalyst consistent with this invention can essentially eliminate this danger because nearly all radiation will be strongly absorbed once the plasma is formed. For this reason, and as described in commonly owned filed U.S. patent application Ser. No. 10/430,415, filed May 7, 2003, which is hereby incorporated by reference in its entirety, one of the sources can be activated before the others to ignite the plasma, and then subsequent source can be activated. Alternatively, a first source can be cross-polarized with a second source.

As explained more fully above, a plasma catalyst can be located at any operational position. For example, a plasma catalyst can be located in the plasma cavity. In this case, the catalyst could be subject to ongoing plasma exposure during the use of the furnace, which could undesirably degrade the catalyst over time. Therefore, a plasma catalyst can also be placed proximate to the cavity, including in a wall of cavity 305 or adjacent to such a wall. For example, in the case of passive plasma catalyst, the catalyst only needs to be placed close enough to cavity 305 such that it deforms the electromagnetic fields in the cavity. In the case of an active catalyst, the source can be placed outside the cavity, but the ionizing particles can be directed into the plasma cavity.

As shown in FIG. 10, cavity 305 can be completely closed, or sealed. Thus, once a sufficient amount of gas in placed in cavity 305, the same gas can be used to repeatedly form a plasma within cavity 305. Alternatively, cavity 305 can include one or more gas ports (not shown) for flowing gas into and out of cavity 305 during plasma generation. Although in this configuration the cavity would not be completely sealed, it could still substantially confine a plasma and be used to generate heat consistent with this invention. Moreover, gas flow can be used, if desired to control the temperature of the plasma. That is, higher gas flow rates could be used to cool, or at least substantially slow down the rate of heating, of a plasma-assisted furnace consistent with this invention.

When cavity 305 is sealed, plasma catalyst 327, as well as the gas, can be located in cavity 305. In this case, the plasma catalyst can be coated with a thermal-protective layer. Alternatively, the catalyst can be moved from an optimum position in the cavity for igniting the plasma to a less optimum position, where the plasma would be less likely to degrade or consume the catalyst during operation. In another embodiment, the plasma catalyst can be fixed in the cavity, but a mode-mixer can be used to change the field distribution within the cavity. For example, the distribution can be originally tuned such that a hot spot is located at the plasma catalyst but then subsequently tuned such that the hot spot is located adjacent to wall 320.

As shown in FIG. 10, heat conducting region 315 can include a thermally conductive conduit for channeling fluid. The fluid can be, for example, a liquid or a gas, or a combination of both. Water, oil, or any other fluid capable of absorbing energy, either by thermal conduction or radiative absorption, can be used. Alternatively, heating region 315 can be configured to contain a heatable solid. Solids, such as iron, can be useful for storing energy in the form of thermal energy. In addition, a furnace consistent with this invention can be used to heat any other type of solid, such as a semiconductor, to perform any type of processing requiring heat.

Figure 11:
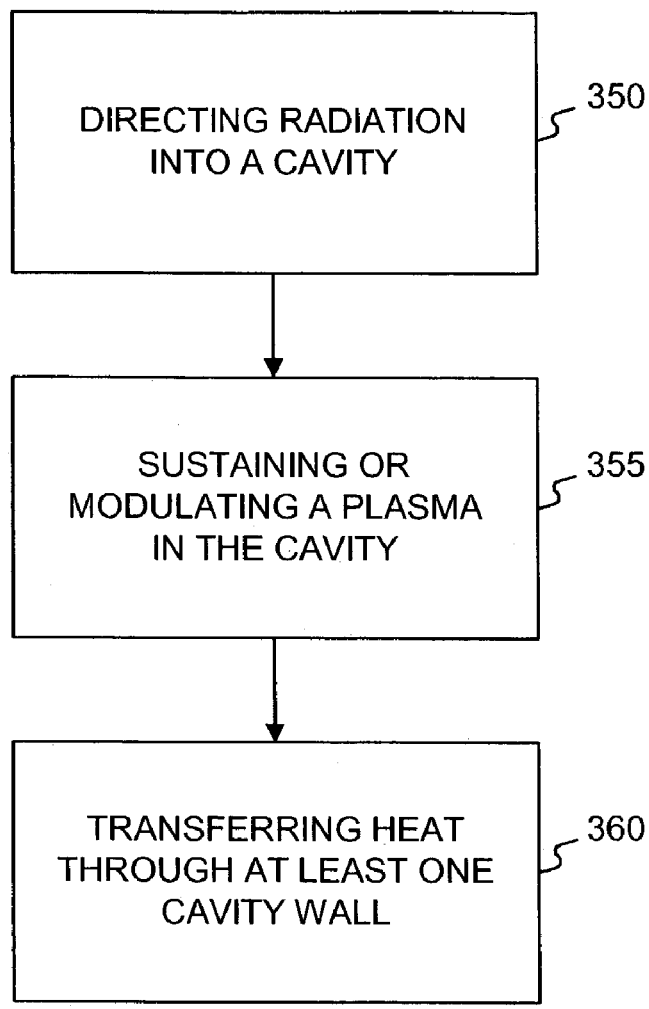
FIG. 11 shows a flow-chart of an illustrative method for plasma-assisted heating consistent with this invention.

FIG. 11 shows a flow-chart of an illustrative method for plasma-assisted heating (e.g., melting) consistent with this invention. In step 350, radiation can be directed into a cavity containing a gas to ignite a plasma in the cavity. In step 355, the plasma can be modulated or sustained in the cavity for a period of time sufficient to heat at least one thermally conductive cavity wall. And, in step 360, heat can be conducted or radiated through the wall to transfer thermal energy to matter on an opposite side of the wall.

As previously explained with respect to apparatus 300, a plasma can be ignited in step 350 by subjecting a gas in the cavity to the radiation in the presence of a plasma catalyst, which may be active or passive. As also previously explained, the plasma can be modulated or sustained by directing radiation into the cavity from at least one radiation source. When multiple radiation sources are used, a first source can direct radiation into the cavity before any of the other sources to ensure that a radiation absorbing plasma has been formed. This can help prevent radiation from reflecting or propagating into these radiation sources and damaging them.

Figure 12:
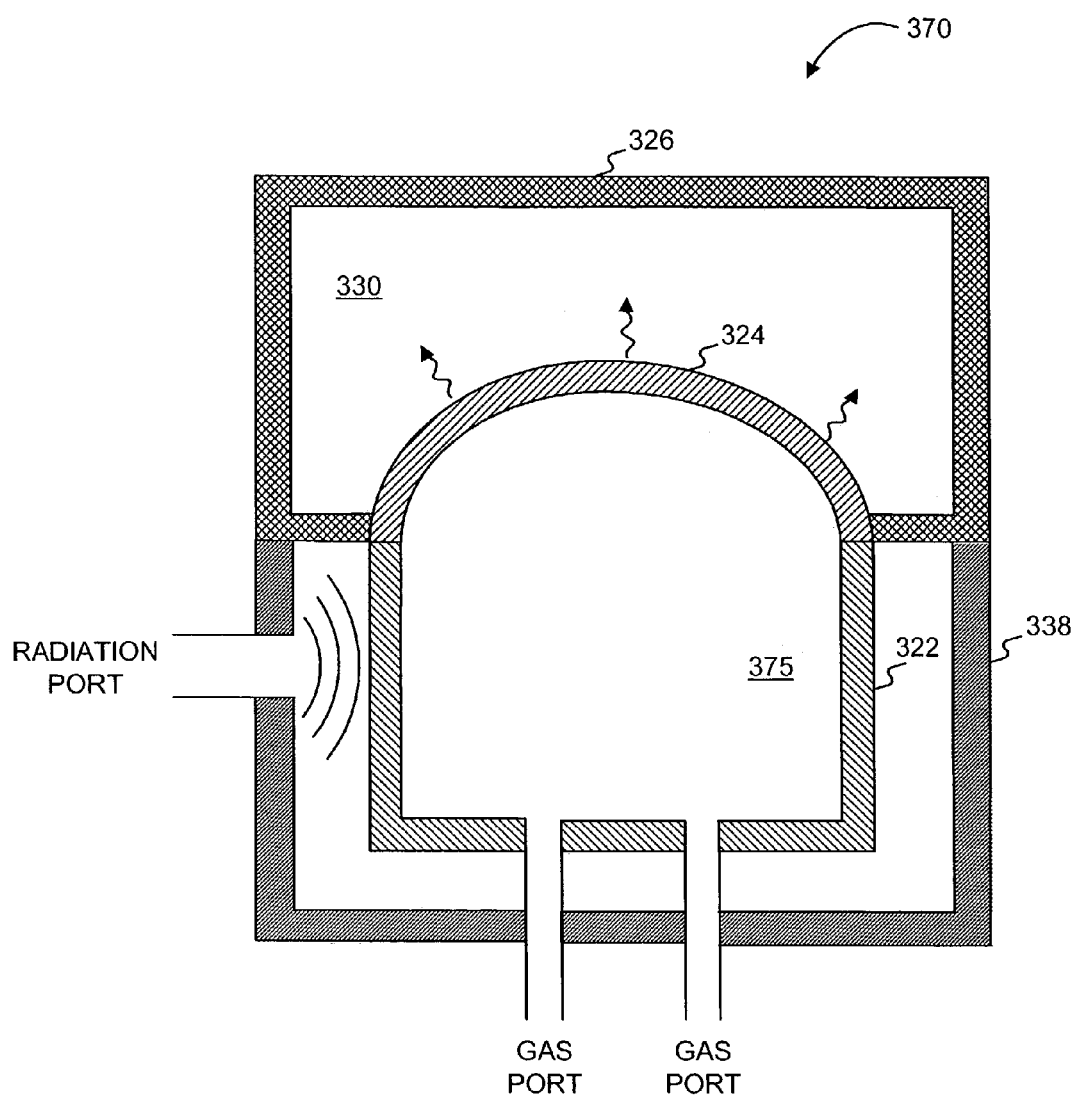
FIG. 12 shows a cross-sectional view of another illustrative plasma-assisted heating apparatus consistent with this invention.

FIG. 12 shows a cross-sectional view of another illustrative plasma-assisted heating apparatus 370. In this example, cavity 375 can include two functional walls: radiation-transmissive wall 322 and thermally conductive wall 324. As previously explained, radiation-transmissive wall 322 can be formed from any material capable of substantially transmitting radiation at the frequency provided by one or more radiation sources. Some of the radiation-transmissive materials that can be used consistent with this invention include, for example, quartz, $Al_2O_3$, and many ceramics.

Based on the mode pattern of the radiation within the outer walls of apparatus 370, walls 322 and 324 can be configured to modulate or sustain a plasma in some regions, and to prevent formation of a plasma in other regions within cavity 375. For example, in one embodiment, plasma formation can be maximized near wall 324, such that a maximum amount of energy can be transferred to heating region 330, which can be located adjacent to heat-conductive wall 324. As explained above, a heating region consistent with this invention can be used to heat a fluid or a solid, depending on the application. In this case, region 330 is partially bound by outer wall 326. Walls 324 and 326, when combined, can form a channel through which a fluid can flow and be heated.

As shown in FIG. 12, wall 324 can be curved to increase its surface area, which can increase the rate that energy passes through wall 324. It will be appreciated that other shapes can also be used. It will also be appreciated that a single furnace could have multiple plasma cavities, and each of those cavities can have the same or different shape.

Also, although not shown in FIG. 12, a plasma catalyst can be used with plasma apparatus 370, and any other plasma-assisted furnace consistent with this invention, to facilitate igniting, modulating, and/or sustaining a plasma. As previously explained, the use of a plasma catalyst can relax the conditions required to form a plasma, which can make the plasma more controllable, even at pressures at or above atmospheric pressure.

It will be appreciated that such catalysts may be particularly useful due to their substantially continuous catalyzing effect, as opposed to spark plugs, for example, which only spark periodically. Continuous catalysis can be especially useful during periodic processes that require repeated striking and restriking of a plasma.

Figure 13:
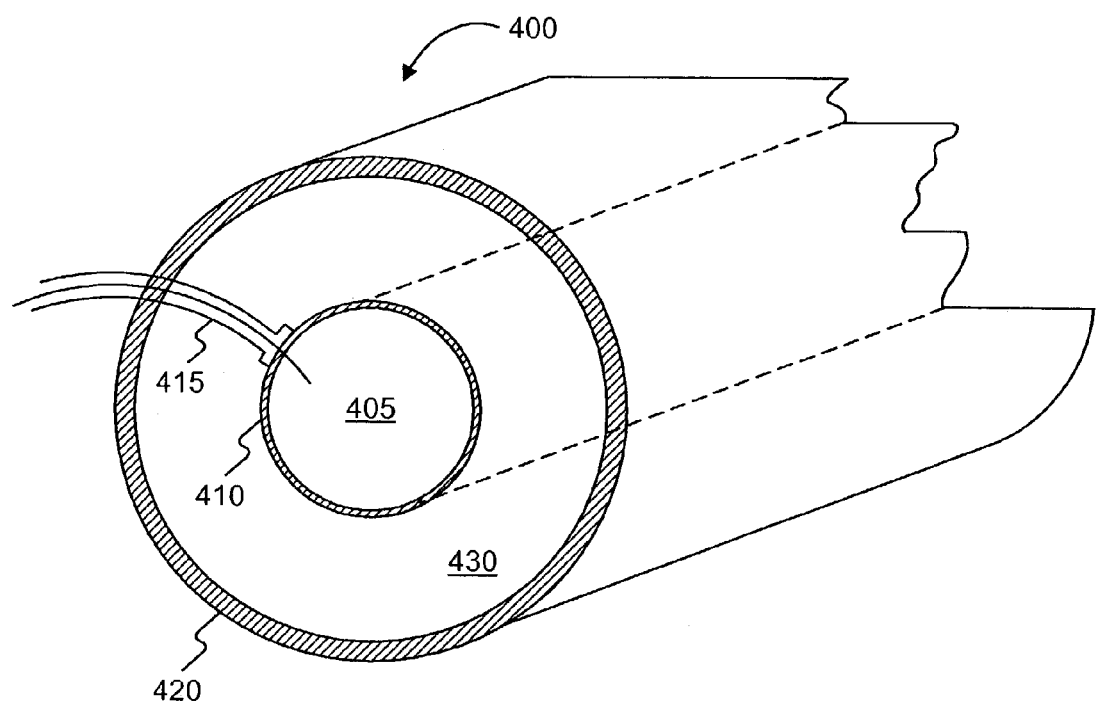
FIG. 13 shows a cross-sectional perspective view of another illustrative plasma-assisted heating apparatus consistent with this invention.

FIG. 13 shows a cross-sectional perspective view of another illustrative plasma-assisted heating apparatus 400. In this apparatus, plasma cavity 405 is cylindrical, although it will be appreciated that the shape can also be rectangular, or any other convenient shape capable of supporting at least one mode of radiation propagation. Cavity 405 can be formed in tube 410 that is at least thermally conductive. Radiation can be directed into cavity 405 in any convenient manner, such as by a waveguide or a coaxial cable. As shown in FIG. 13, coaxial cable 415 can be used to direct radiation into cavity 405. Plasma tube 410 can be open or closed. If open, the gas can flow longitudinally.

Plasma tube 410 can be located inside of outer tube 420. In this way, heating region 430 can be located between tube 410 and 420 and a fluid can be heated while flowing through this region. It will be appreciated that the shape of outer tube 420 need not be cylindrical, but can be rectangular or any other convenient shape.

Figure 14:
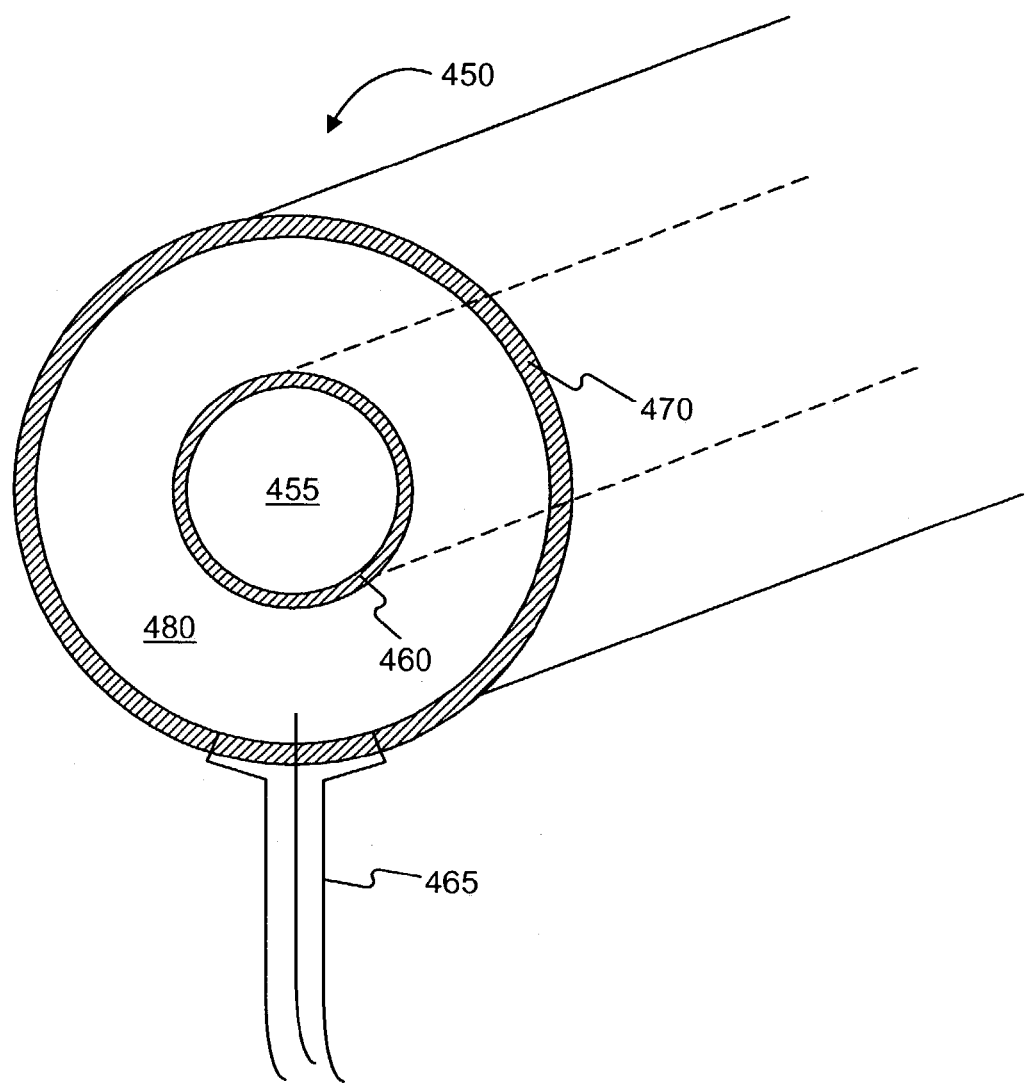
FIG. 14 shows a cross-sectional perspective view of yet another illustrative plasma-assisted heating apparatus consistent with this invention.

FIG. 14 shows a cross-sectional perspective view of yet another illustrative plasma-assisted heating apparatus 450. In this apparatus, plasma cavity 480 can be an annular space between two electrically conducting tubes (e.g., in a co-axial waveguide). Tubes 460 and 470 are shown to be cylindrical, for example, but the shape can also be rectangular or any other convenient shape. Thus, cavity 480 can be formed between tube 460, which can be thermally conductive, and tube 470, which can be electrically conductive and surrounded by an insulating jacket (not shown).

During operation, radiation can be directed into cavity 480 in any convenient manner, such as by a waveguide or a coaxial cable. As shown in FIG. 14, coaxial cable 465 can be used to direct radiation into cavity 480. Alternatively, the radiation can be fed coaxially through a radiation-transmissive window (not shown). Also, heating region 455 can be located inside tube 460 and a fluid can be heated while flowing through this region.

It will also be appreciated that although tubes 410 and 420 of FIG. 13 and tubes 460 and 470 of FIG. 14 are shown as straight, they need not be. For example, the tubes can have a spiral, serpentine, or any other convenient form. It will also be appreciated that the positions of heating regions 430 and 480 can be reversed with plasma cavities 405 and 455, respectively.

Figure 15:
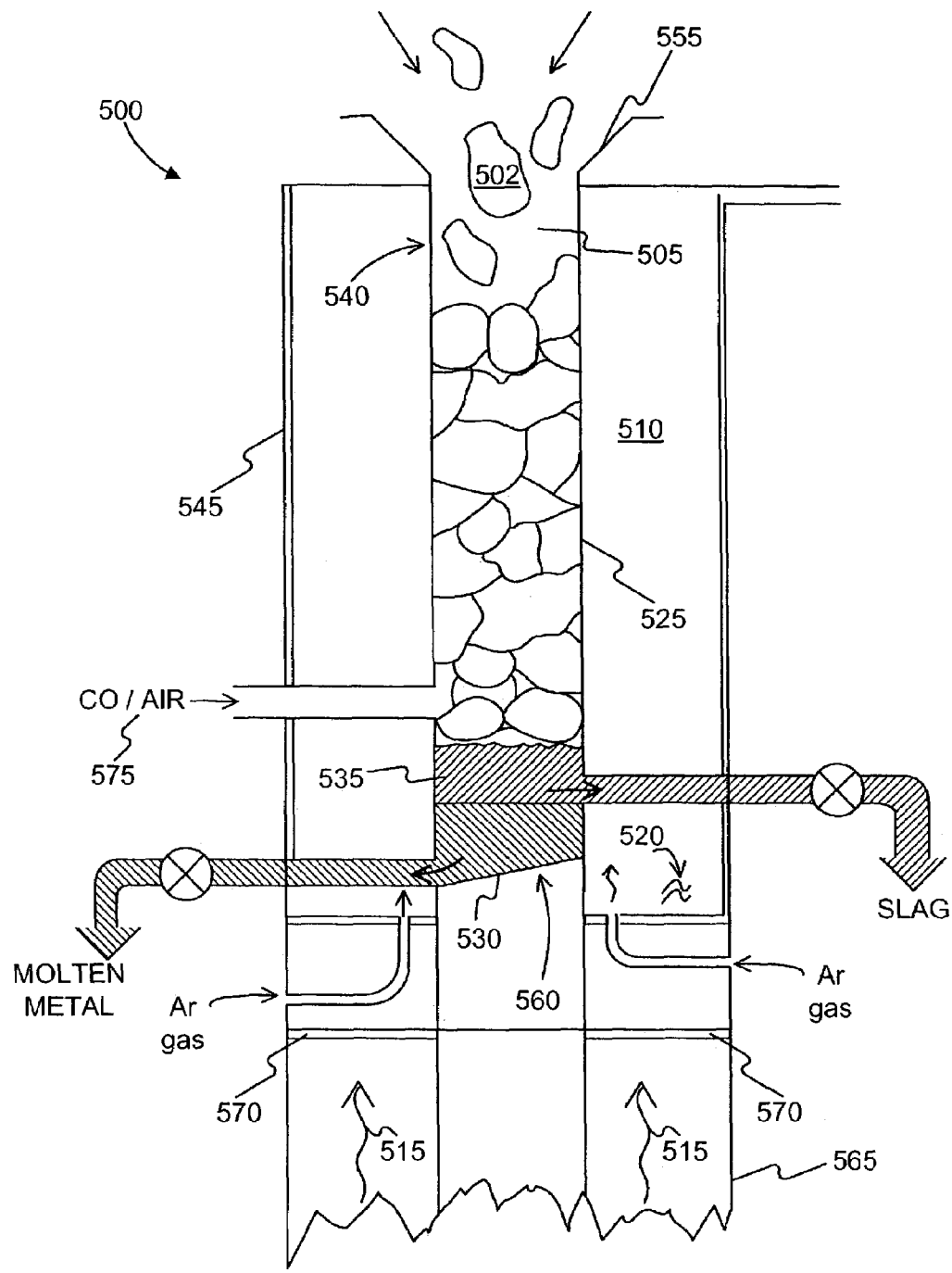
FIG. 15 shows a cross-sectional view of an illustrative plasma-assisted melting furnace consistent with this invention.

FIG. 15 shows a cross-sectional view of illustrative plasma-assisted melting furnace consistent with this invention. Furnace 500 can include melting column 505, surrounding plasma cavity 510, and electromagnetic radiation source (not shown) for directing electromagnetic radiation 515 having a frequency less than about 333 GHz into plasma cavity 510. Additional structural elements (shown and not shown) are described below in conjunction with a method for melting objects, such as metal ore, scrap metal, and other solids, including solid waste.

In one embodiment, an illustrative method for melting metal ore can include adding metal ore 502 to a melting region (e.g., melting column 505), forming a plasma in cavity 510 by subjecting a gas (e.g., argon) to electromagnetic radiation 515 in the presence of plasma catalyst 520 (e.g., carbon fiber), sustaining the plasma in cavity 510 such that energy from the plasma passes through thermally conductive wall 525 of cavity 510 into melting column 505 and melts metal ore 502 into molten metal 530 and slag 535, and then collecting molten metal 530.

Plasma catalyst 520 can be an active plasma catalyst and a passive plasma catalyst. Because these such catalysts have been described in detail above, they are not described here again, although it will be understood that any of the previously mentioned catalysts, and any of the associated methods, can be used to melt objects, such as metal ore or solid waste, consistent with this invention.

As shown in FIG. 15, melting column 505 can be at least partially defined by conductive wall 525 of inner tube 540. Similarly, cavity 510 can be defined between inner tube 540 and outer tube 545. Inner tube 540 can be located substantially inside outer tube 550, if desired. When tubes 540 and 545 are oriented substantially vertically, two or more gases can be used to preferentially form a plasma closer to inner tube 540. In one embodiment, a first gas (e.g., argon), which can form a plasma relatively easily, can be flowed into cavity 510 near inner tube 540 so that the gas flows close to wall 525 and forms a plasma there. A second gas (not shown), which may not as easily form a plasma as the first gas, can also flow into cavity 510 near outer tube 545 while sustaining the plasma. It will be appreciated that additional embodiments for preferentially forming a plasma near wall 525 can also involve application of electric and/or magnetic fields.

During operation, melting column 505 can be substantially vertical. Then, metal ore can be added to top end 555 of melting column 505 and molten metal 530 can be collected at bottom end 560 of melting column 505. Radiation 515 can be directed into cavity 510 through coaxial waveguide 565, which can be separated from cavity 510 by radiation-transmissive plate 570. In one embodiment, inner tube 525 can have an outer diameter and outer tube 545 can have an inner diameter, such that the ratio of the inner diameter to the outer diameter is between about 2.5 and about 3.0, including about 2.72. Depending on the solid being melted, treated, or extracted, suitable reactant 575 (e.g., a reducing agent, such as air plus coke, or carbon monoxide) can be added to the components. This addition can be used, for example, to separate metal from other related compounds.

It will be appreciated that a movable conductive plate (not shown) can be placed at one or both of the axial ends of cavity 510 to adjust its length. By adjusting this length, the electromagnetic radiation standing wave pattern can be shifted as desired. In one embodiment, the plate can be used to shift the pattern by at least about a quarter of a wavelength.

The spatial dependence of electromagnetic radiation absorption can also be adjusted by applying an electric potential difference between inner tube 540 and outer tube 545. The applied potential can attract the plasma radially inward and increase its concentration at the surface of wall 525, thereby increasing the rate at which energy passes through conductive wall 525.

Figure 15A:
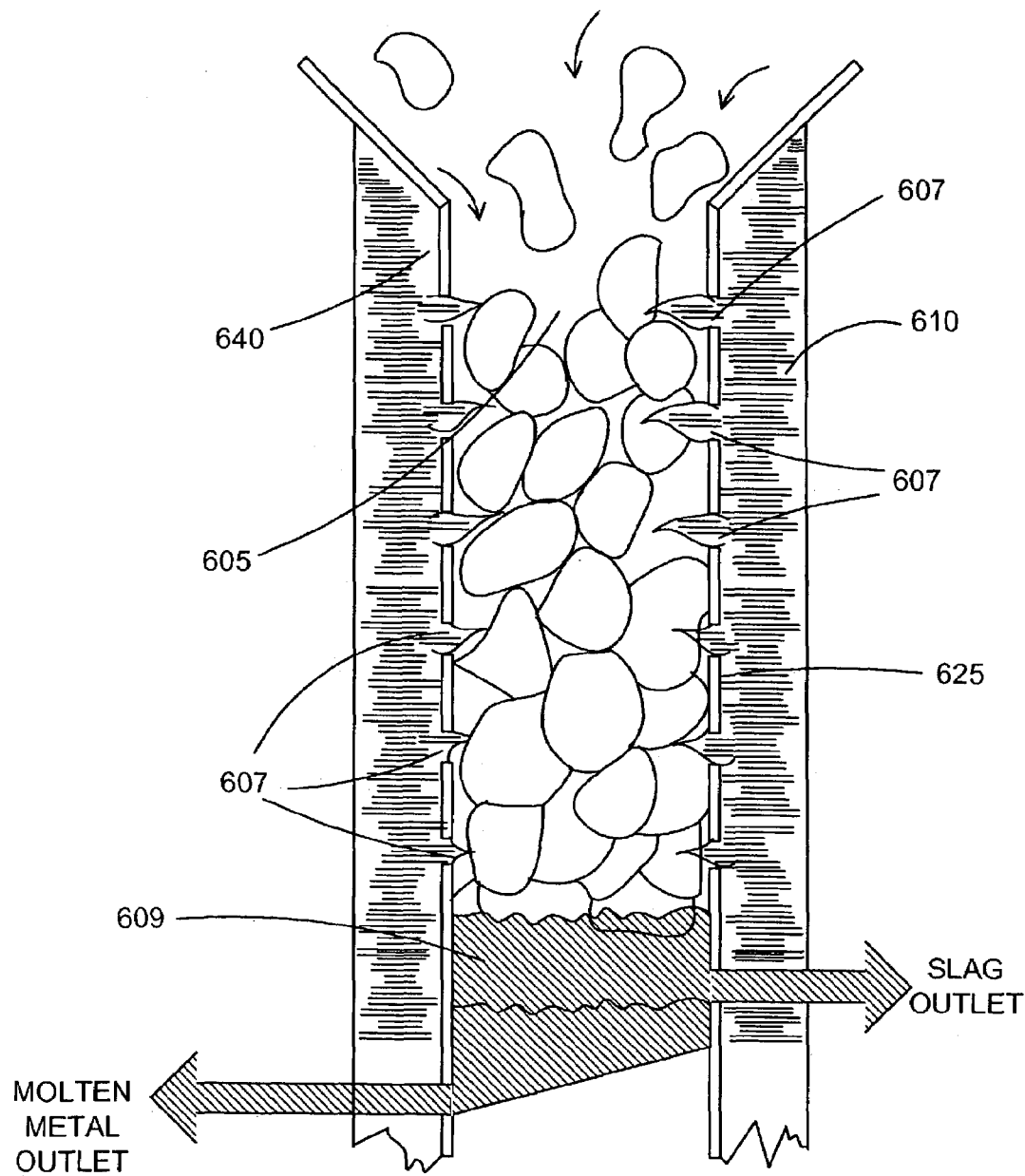
FIG. 15A shows a cross-sectional view of another illustrative plasma-assisted melting furnace in which its inner tube is porous consistent with this invention.

FIG. 15A shows a cross-sectional view of another illustrative embodiment in which inner tube 640 is porous. In this case, plasma formed in cavity 610 can flow into melting column 605 to heat the objects located there, although care should be taken to ensure that apertures 607 in tube 640 are located above slag 609 or any other liquid that may form in column 605. Thus, wall 625 need not be thermally conductive. As already described above, the plasma can be used to convey one or more reactants into column 605. To prevent molten metal and other undesirable liquids and gases from flowing from column 605 into cavity 610, the longitudinal axes of apertures 607 can be directed in a downward direction. That is, the end of each aperture that opens into cavity 610 can be higher than the end of the same aperature that opens into column 605. Many of the components shown in FIG. 15A and subsequent FIGS. are not described here because they are already described above with respect to FIG. 15.

Additional plasma-assisted melting methods and apparatus are also provided consistent with this invention. For example, in one embodiment, the method can include forming a plasma in a cavity by subjecting a first gas to electromagnetic radiation having a frequency less than about 333 GHz in the presence of a plasma catalyst, heating a second gas with the plasma, adding a solid to a melting vessel, directing the heated second gas toward the solid sufficient to at least melt the solid into a liquid, and collecting the liquid.

It will be appreciated that the solid can be metal ore, scrap metal, or any other solid, and the liquid can be a molten metal, for example. The first gas can be any gas known to form a plasma, such as argon, under suitable conditions. Similarly, the second gas can be air. Moreover, the first and second gases can be the same, if desired, and contain one or more additives. As already discussed above in detail, plasma can be ignited, modulated, or sustained (e.g., at atmospheric pressure) using a plasma catalyst consistent with this invention, including passive and active catalysts. Accordingly, the many possible catalysts that can be used consistent with this invention will not be discussed here again.

Figure 16:
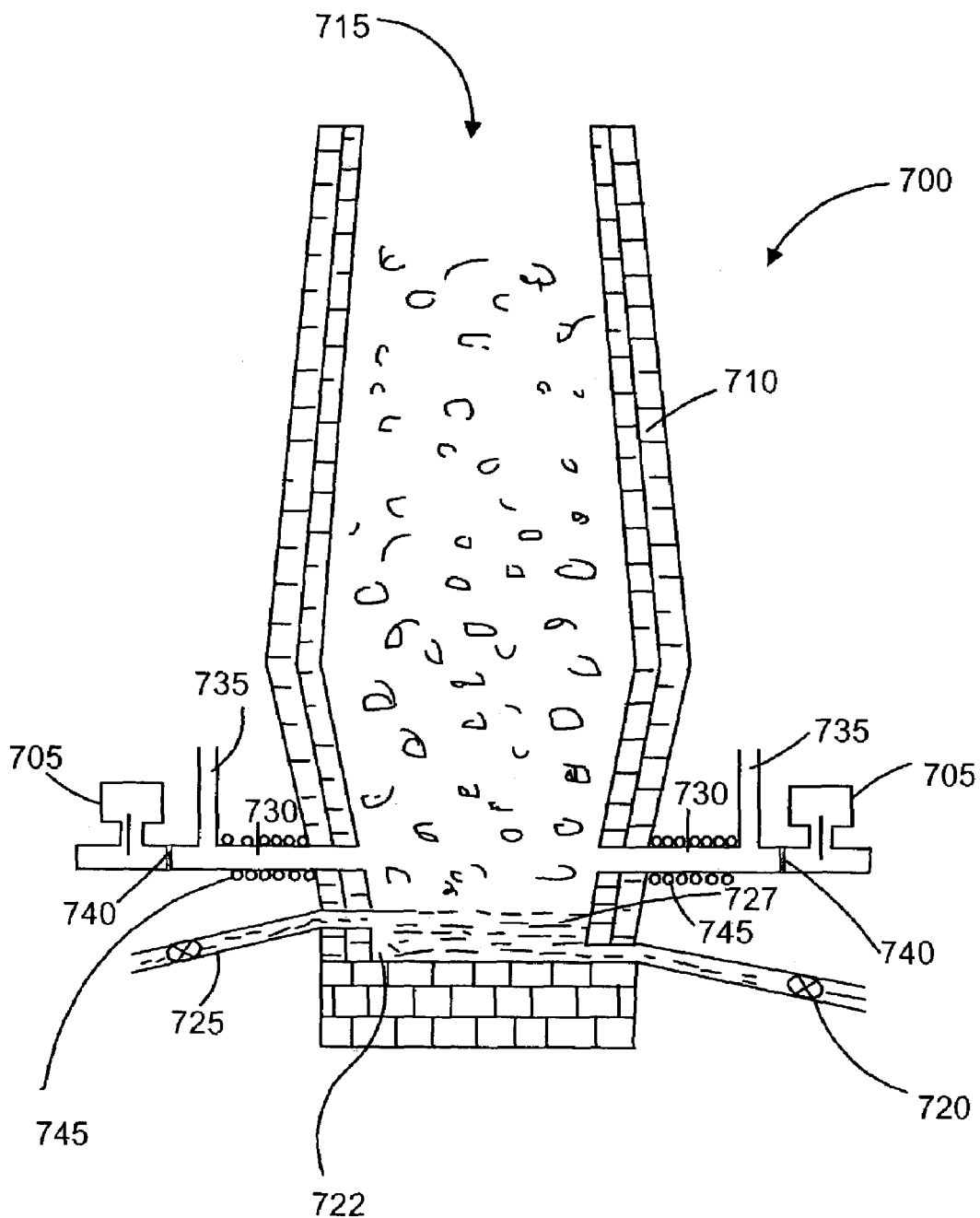
FIG. 16 shows a cross-sectional view of yet another illustrative plasma-assisted melting furnace with multiple electromagnetic radiation sources consistent with this invention.

FIG. 16 shows a cross-section of another illustrative plasma-assisted melting furnace 700 with multiple electromagnetic radiation sources 705. In this case, two layers of refractory bricks 710 line melting column 715 and the solid to be melted is shown schematically in furnace 700. As shown in FIGS. 15 and 15A, the bottom of furnace 700 includes at least one outlet channel 720 for removing liquefied solid 722. In addition, furnace 700 can also include at least one channel 725 for removing slag 727 or any other undesirable melting byproduct.

During operation, a plasma can be formed in plasma cavity 730. The plasma can be formed from a gas that is fed through inlet 735. Plasma cavity 730 and radiation source 705 can be separated by window 740, which can be substantially transmissive to the electromagnetic radiation generated by source 705. As discussed more fully above, the radiation can be directed to plasma cavity 730 using any conventional technique, including coaxial cables, antennas, and waveguides of any kind. Thus, source 705 can be coupled to plasma cavity 730 axially or otherwise using any of these techniques, or mounted directly to plasma cavity 730.

In one embodiment, a magnetic field can be applied to plasma cavity 730 using a magnet, such as electromagnet 745. As shown in FIG. 16, electromagnet 745 can be a coil wrapped around plasma cavity 730. The coil can then be connected to a power source (not shown) configured to pass electric current through the coil. In this way, the magnetic field can be oriented axially—that is, along the axis of an elongated plasma cavity.

Figure 17:
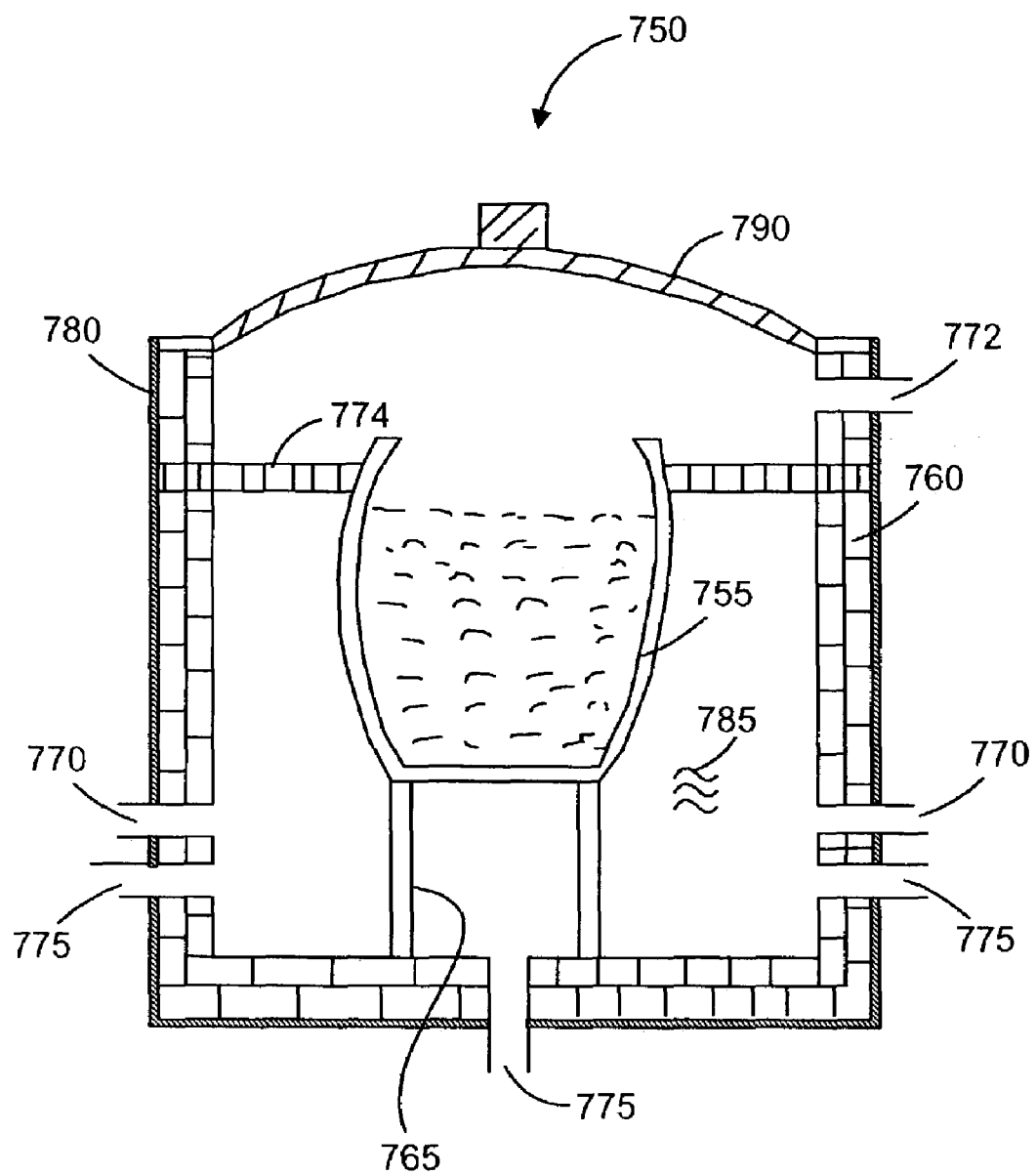
FIG. 17 shows still another embodiment of plasma-assisted furnace for melting solids, such as metals, consistent with this invention.

FIG. 17 shows another embodiment of plasma-assisted furnace 750 for melting solids, such as metals. Furnace 750 can include refractory housing 760, which may be formed, for example, from refractory bricks, crucible 755 for containing the melting and/or melted solids, which may be formed from any material capable of withstanding the high temperatures necessary to melt the solid in crucible 755, support frame 765 for supporting crucible 755, at least one gas port 770 for supplying or evacuating gas from within housing 760, at least one electromagnetic radiation port 775 for directing electromagnetic radiation into housing 760, and optionally outer metallic shell 780 to prevent the radiation from escaping the housing and thus preventing a potential health hazard. In one embodiment, a gap (not shown) can be formed between shell 780 and housing 760 through which gas can flow. This can be used, for example, to preheat the gas supplied by port 770 and forms the plasma within housing 760.

Housing 760 can further include metallic lid 790 (which may be thermally insulated) to prevent electromagnetic radiation from escaping. Housing 760 can also include plate 774, which may be metal and may include one or more holes to permit gas to flow therethrough and out of housing 760 through exhaust port 772. Alternatively, plate may be substantially nonporous, in which case exhaust gas can flow out through one or more gas ports 770.

It will be appreciated by one of ordinary skill in the art that support frame 760 can be configured to tilt and drain its melted contents, if desired. It will also be appreciated that the temperature of the plasma-assisted melting process can be monitored, as described above, using (for example) a pyrometer. Also as described above, plasma catalyst 785 can be located in any convenient position to ignite, modulate, or sustain the plasma in housing 760, above, at, or below atmospheric pressure. Finally, one or more magnetic fields may be applied to the plasma to effect its location and heating characteristics.

Figure 18:
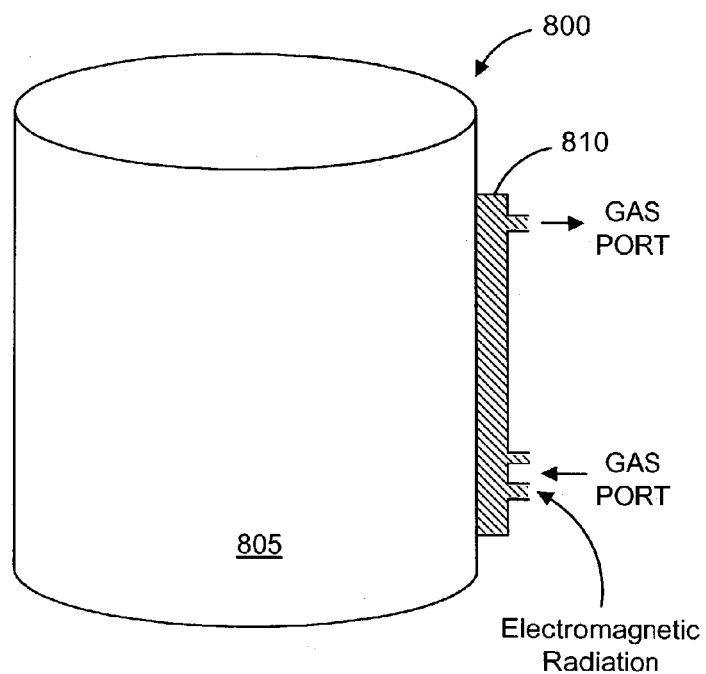
FIG. 18 shows a simplified cross-sectional view of yet another plasma-assisted melting furnace that includes a crucible and at least one plasma cavity in thermal contact with an outer surface of the crucible consistent with this invention.

FIG. 18 shows a simplified cross-sectional view of yet another plasma-assisted melting furnace 800, but does not show optional insulation jacket, drain pipe for molten metal, and lid. Furnace 800 can include crucible 805 and at least one plasma cavity 810 in thermal contact with an outer surface of crucible 805. As described repeatedly above, plasma cavity 810 can include one or more gas and electromagnet radiation ports. It will also be appreciated that plasma cavity 810 can be substantially spiral or serpentine (not shown) or straight (shown). In any case, when multiple plasma cavities are used, each cavity can be controlled separately to control the temperature of the crucible or the material inside. Moreover, each of the plasma cavity sections can be oriented vertically, horizontally, or any combination thereof, and can be supplied electromagnetic radiation by separate sources, if desired.

Figure 19:
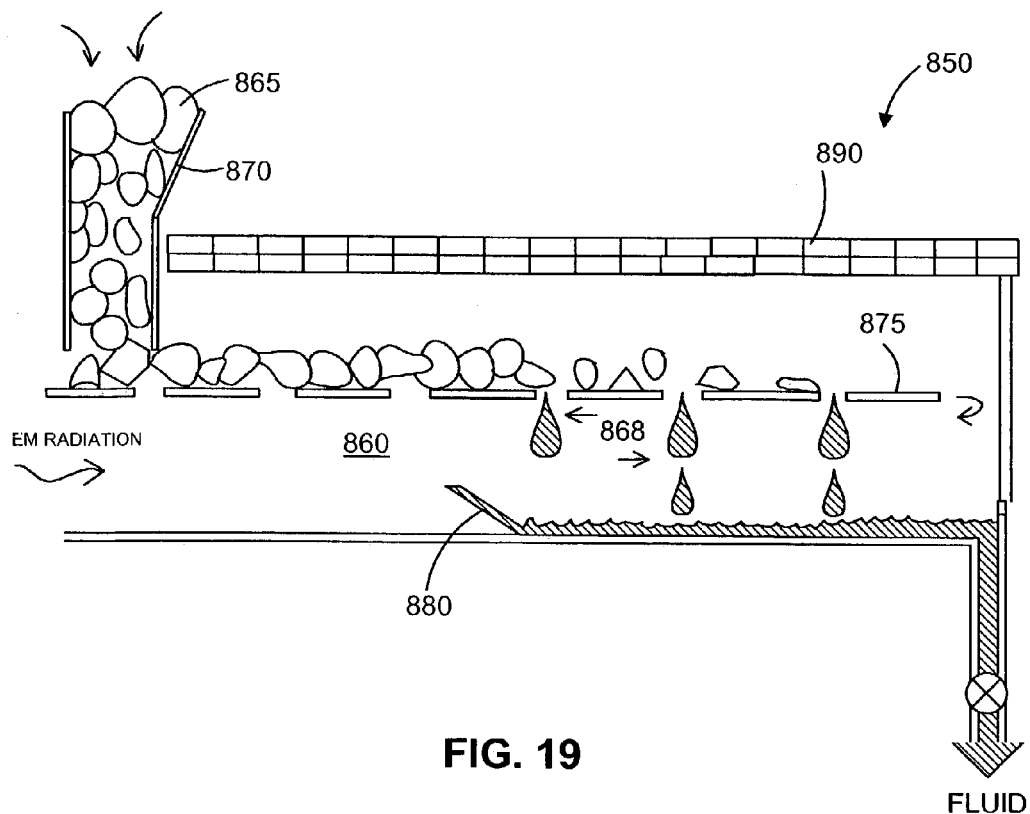
FIG. 19 shows another illustrative embodiment of plasma-assisted melting furnace that includes a conveyor consistent with this invention.

FIG. 19 shows another illustrative embodiment of plasma-assisted melting furnace 850 in which a plasma can be formed in a cavity by subjecting a gas to electromagnetic radiation having a frequency less than about 333 GHz, optionally in the presence of a plasma catalyst. Furnace 850 can include conveyor 875 and at least one plasma cavity 860 such that the solid can be conveyed through a plasma formed in cavity 860 until the solid melts and the liquid is collected. As shown in FIG. 19, solid particles 865 (e.g., scrap iron) can be fed into hopper 870 and deposited on to heat-resistant conveyor 875. In this way, conveyor 875 can convey particles 865 through the plasma, which can be formed above or below conveyor 875.

In one embodiment, conveyor 875 can convey solid particles 865 through plasma cavity 860. As shown in FIG. 19, conveyor 875 may be porous and permit melted portions 868 to pass beneath conveyor 875 into collection conduit 880. It will be appreciated that when conveyor 875 is positioned in an upper portion of cavity 860, it is possible to take advantage of the plasma's natural tendancy to rise in the cavity and substantially engulf particles 865. Conveyor 875 can also be positioned above or below a plasma cavity (not shown) that is different from housing 890. In this case, the cavity can be used to form one or more plasma jets, which can be directed at conveyor 875 and particles 865 to melt them. Once conveyor 875 has conveyed the particles through a plasma, conveyor 875 can be recycled.

In the foregoing described embodiments, various features are grouped together in a single embodiment for purposes of streamlining the disclosure. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this Detailed Description of Embodiments, with each claim standing on its own as a separate preferred embodiment of the invention.

We claim:

1. A plasma-assisted melting method comprising:
   Forming a plasma in a cavity by subjecting a first gas to electromagnetic radiation having a frequency less than about 333 GHz in the presence of a plasma catalyst;
   wherein the plasma catalyst comprises at least one of an active plasma catalyst and a passive plasma catalyst;
   wherein the catalyst comprises at least one of metal, inorganic material, carbon, carbon-based alloy, carbon-based composite, electrically conductive polymer, conductive silicone elastomer, polymer nanocomposite, and an organic-inorganic composite;
   heating a second gas with the plasma;
   adding a solid to a melting vessel;
   directing the heated second gas toward the solid sufficient to at least melt the solid into a liquid; and
   collecting the liquid.

2. The method of claim 1, wherein the solid comprises a metal and the liquid comprises a molten metal.

3. The method of claim 1, wherein the forming occurs at a gas pressure that is at least atmospheric pressure.

4. The method of claim 1, wherein the subjecting comprises directing the electromagnetic radiation from a plurality of radiation sources into the cavity.

5. The method of claim 1, wherein the first and second gases are the substantially the same.

6. A plasma-assisted melting method comprising:
   forming a plasma in a cavity by subjecting a first gas to electromagnetic radiation having a frequency less than about 333 GHz in the presence of a plasma catalyst;
   wherein the catalyst is in the form of at least one of a nano-particle, a nano-tube, a powder, a dust, a flake, a fiber, a sheet, a needle, a thread, a strand, a filament, a yarn, a twine, a shaving, a sliver, a chip, a woven fabric, a tape, and a whisker;
   heating a second gas with the plasma;
   adding a solid to a melting vessel;
   directing the heated second gas toward the solid sufficient to at least melt the solid into a liquid; and
   collecting the liquid.

7. A plasma-assisted melting method comprising:
   forming a plasma in a cavity by subjecting a first gas to electromagnetic radiation having a frequency less than about 333 GHz in the presence of a plasma, catalyst;
   wherein the plasma catalyst comprises an active plasma catalyst including at least one ionizing particle;
   heating a second gas with the plasma;
   adding a solid to a melting vessel;
   directing the heating second gas toward the solid sufficient to at least melt the solid into a liquid; and
   collecting the liquid.

8. The method of claim 7, wherein the at least one ionizing particle comprises a beam of particles.

9. The method of claim 7, wherein the particle is at least one of an x-ray particle, a gamma ray particle, an alpha particle, a beta particle, a neutron, and a proton.

10. The method of claim 7, wherein the at least one ionizing particle is a charged particle.

11. The method of claim 7, wherein the ionizing particle comprises a radioactive fission product.

12. A plasma-assisted melting method comprising:
   adding a solid to a melting region;
   forming a plasma in a cavity by subjecting a gas to electromagnetic radiation having a frequency less than about 333 GHz in the presence of a plasma catalyst, wherein the cavity has a wall;

wherein the plasma catalyst comprises at least one of an active plasma catalyst and a passive plasma catalyst;

wherein the catalyst comprises at least one metal, inorganic material, carbon, carbon-based alloy, carbon-based composite, electrically conductive polymer, conductive silicone elastomer, polymer nanocomposite, and an organic-inorganic composite;

sustaining the plasma in the cavity such that energy from the plasma passes through the wall into the melting region and melts the solid into liquid; and collecting the liquid.

13. The method of claim 12, wherein the catalyst is in the form of at least one of a nano-particle, a nano-tube, a powder, a dust, a flake, a fiber, a sheet, a needle, a thread, a strand, a filament, a yarn, a twine, a shaving, a sliver, a chip, a woven fabric, a tape, and a whisker.

14. The method of claim 13, wherein the catalyst comprises carbon fiber.

15. The method of claim 12, wherein the forming occurs at a gas pressure that is at least atmospheric pressur.

16. The method of claim 12, wherein the melting region is substantially defined by the wall of an inner tube and wherein the cavity is defined between the inner tube and an outer tube substantially surrounding the inner tube.

17. The method of claim 12, further comprising:
flowing the gas into the cavity near the inner tube during the sustaining; and
flowing a second gas into the cavity near the outer tube during the sustaining, wherein the second gas does not substantially form the plasma.

18. The method of claim 17, wherein the melting region is a substantially vertical channel, and wherein the adding comprises adding metal ore to a top end of the melting region and collecting molten metal near a bottom end of the melting region.

19. The method of claim 12, further comprising flowing the gas into the cavity during the sustaining.

20. The method of claim 12, further comprising directing the radiation into the cavity through a coaxial waveguide.

21. The method of claim 12, wherein the subjecting comprises directing the electromagnetic radiation from a plurality of radiation sources into the cavity.

22. The method of claim 21, wherein the plurality of radiation sources comprises at least one ring of magnetrons.

23. The method of claim 21 wherein the sustaining comprises permitting thermal energy to conduct through the wall.

24. The method of claim 12, wherein the cavity comprises a plurality of elongated cavities in thermal communication with the melting region.

25. A plasma-assisted melting method comprising:
adding a solid to a melting region;
forming a plasma in a cavity by subjecting a gas to electromagnetic radiation having a frequency less than about 333 GHz in the presence of a plasma catalyst, wherein the cavity has a wall;
wherein the plasma catalyst comprises at least one of an active plasma catalyst and a passive plasma catalyst; and
wherein the catalyst is in the form of at least one of a nano-particle, a nano-tube, a powder, a dust, a flake, a fiber, a sheet, a needle, a thread, a strand, a filament, a yarn, a twine, a shaving, a sliver, a chip, a woven fabric, a tape, and a whisker.

26. A plasma-assisted melting method comprising:
adding a solid to a melting region;
forming a plasma in a cavity by subjecting a gas to electromagnetic radiation having a frequency less than about 333 GHz in the presence of a plasma catalyst, wherein the cavity has a wall;
wherein the plasma catalyst comprises an active plasma catalyst including at least one ionizing particle;
sustaining the plasma in the cavity such that energy from the plasma passes through the wall into the melting region and melts the solid into liquid; and
collecting the liquid.

27. The method of claim 26, wherein the at least one ionizing particle comprises a beam of particles.

28. The method of claim 26, wherein the particle is at least one of an x-ray particle, a gamma ray particle, an alpha particle, a beta particle, a neutron, and a proton.

29. The method of claim 26, wherein the at least one ionizing particle is a charged particle.

30. The method of claim 26, wherein the ionizing particle comprises a radioactive fission product.

31. A plasma-assisted melting method comprising:
adding a solid to a melting region;
forming a plasma in a cavity by subjecting a gas to electromagnetic radiation having a frequency less than about 333 GHz in the presence of a plasma catalyst, wherein the cavity has a wall;
sustaining the plasma in the cavity such that energy from the plasma passes through the wall into the melting region and melts the solid into liquid;
wherein the melting region is substantially defined by the wall of an inner tube and wherein the cavity is defined between the inner tube and an outer tube substantially surrounding the inner tube;
wherein the inner tube has an outer diameter and the outer tube has an inner diameter, wherein the ratio of the inner diameter to the outer diameter is between about 2.5 and about 3.0; and
collecting the liquid.

32. The method of claim 31, wherein the ratio is about 2.72.

33. A plasma-assisted melting method comprising:
adding a solid to a melting region;
forming a plasma in a cavity by subjecting a gas to electromagnetic radiation having a frequency less than about 333 GHz in the presence of a plasma catalyst, wherein the cavity has a wall; and
wherein the cavity has a first axial end, the method further comprises launching the radiation into the main cavity from at least the first axial end;
sustaining the plasma in the cavity such that energy from the plasma passes through the wall into the melting region and melts the solid into liquid; and
collecting the liquid.

34. A plasma-assisted melting method comprising:
adding a solid to a melting region;
forming a plasma in a cavity by subjecting a gas to electromagnetic radiation having a frequency less than about 333 GHz in the presence of a plasma catalyst, wherein the cavity has a wall;
sustaining the plasma in the cavity such that energy from the plasma passes through the wall into the melting region and melts the solid into liquid;
wherein the cavity has a spiral shape that is wrapped around the melting region; and
collecting the liquid.

35. A plasma-assisted melting method comprising:
forming a plasma in a cavity by subjecting a gas to electromagnetic radiation having a frequency less than about 333 GHz in the presence of a plasma catalyst;
wherein the subjecting comprises directing the electromagnetic radiation from a plurality of radiation sources into the cavity;
wherein the plurality of radiation sources comprises at least one ring of magnetrons;
conveying metal through the plasma until the metal melts into a molten metal; and
collecting the molten metal.

36. The method of claim 1, wherein the catalyst is in the form of at least one of a nano-particle, a nano-tube, a powder, a dust, a flake, a fiber, a sheet, a needle, a thread, a strand, a filament, a yarn, a twine, a shaving, a sliver, a chip, a woven fabric, a tape, and a whisker.

37. The method of claim 36, wherein the catalyst comprises carbon fiber.

38. The method of claim 35, wherein the cavity is in fluid communication with the melting region through a plurality of apertures, the method further comprising forming a plurality of respective plasma jets directed into the melting region at the apertures.

39. A plasma-assisted melting method comprising:
forming a plasma in a cavity by subjecting a gas to electromagnetic radiation having a frequency less than about 333 GHz in the presence of a plasma catalyst;
wherein the plasma catalyst comprises at least one of an active plasma catalyst and a passive plasma catalyst;
conveying metal through the plasma until the metal melts into a molten metal; and
collecting the molten metal.

40. The method of claim 39, wherein the catalyst comprises at least one of metal, inorganic material, carbon, carbon-based alloy, carbon-based composite, electrically conductive polymer, conductive silicone elastomer, polymer nanocomposite, and an organic-inorganic composite.

41. The method of claim 40, wherein the catalyst is in the form of at least one of a nano-particle, a nano-tube, a powder, a dust, a flake, a fiber, a sheet, a needle, a thread, a strand, a filament, a yarn, a twine, a shaving, a sliver, a chip, a woven fabric, a tape, and a whisker.

42. The method of claim 41, wherein the catalyst comprises carbon fiber.

43. The method of claim 39, wherein the catalyst is in the form of at least one of a nano-particle, a nano-tube, a powder, a dust, a flake, a fiber, a sheet, a needle, a thread, a strand, a filament, a yarn, a twine, a shaving, a sliver, a chip, a woven fabric, a tape, and a whisker.

44. The method of claim 39, wherein the plasma catalyst comprises an active plasma catalyst including at least one ionizing particle.

45. The method of claim 44, wherein the at least one ionizing particle comprises a beam of particles.

46. The method of claim 44, wherein the particle is at least one of an x-ray particle, a gamma ray particle, an alpha particle, a beta particle, a neutron, and a proton.

47. The method of claim 44, wherein the at least one ionizing particle is a charged particle.

48. The method of claim 44, wherein the ionizing particle comprises a radioactive fission product.

49. A plasma-assisted melting method comprising:
forming a plasma in a cavity by subjecting a gas to electromagnetic radiation having a frequency less than about 333 GHz in the presence of a plasma catalyst;
conveying metal through the plasma until the metal melts into a molten metal;
wherein the conveying is on a heat-resistant conveyor and the plasma is formed beneath the conveyer; and
collecting the molten metal.

* * * * *